(12) United States Patent
Kang et al.

(10) Patent No.: US 11,515,381 B2
(45) Date of Patent: Nov. 29, 2022

(54) DISPLAY DEVICE WITH SIDE SURFACE ELECTRODE AND METHOD OF MANUFACTURING THE SAME

(71) Applicant: Samsung Display Co., Ltd., Yongin-si (KR)

(72) Inventors: Eui Jeong Kang, Suwon-si (KR);
Byoungyong Kim, Seoul (KR);
Seung-Soo Ryu, Hwaseong-si (KR);
Sanghyeon Song, Seoul (KR);
Donghyun Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 233 days.

(21) Appl. No.: 16/894,850

(22) Filed: Jun. 7, 2020

(65) Prior Publication Data
US 2021/0028267 A1 Jan. 28, 2021

(30) Foreign Application Priority Data
Jul. 23, 2019 (KR) ........................ 10-2019-0088991

(51) Int. Cl.
*H01L 27/32* (2006.01)
(52) U.S. Cl.
CPC .... *H01L 27/3276* (2013.01); *H01L 2227/323* (2013.01)
(58) Field of Classification Search
CPC ...................... H01L 27/3276; H01L 2227/323
See application file for complete search history.

(56) References Cited

U.S. PATENT DOCUMENTS

| 10,156,748 | B2 | 12/2018 | Wu et al. |
| 10,180,607 | B2 | 1/2019 | Kong et al. |
| 10,373,586 | B2 | 8/2019 | Ye et al. |
| 2014/0043855 | A1* | 2/2014 | Kang .................. G02B 6/0083 362/612 |
| 2017/0357121 | A1* | 12/2017 | Cho ...................... G02F 1/1368 |
| 2017/0358602 | A1* | 12/2017 | Bae ..................... G02F 1/13458 |
| 2018/0067353 | A1* | 3/2018 | Son ......................... H01L 24/05 |

(Continued)

FOREIGN PATENT DOCUMENTS

| KR | 10-2017-0034078 | 3/2017 |
| KR | 10-2017-0080937 | 7/2017 |

(Continued)

*Primary Examiner* — Lex H Malsawma
(74) *Attorney, Agent, or Firm* — H.C. Park & Associates, PLC

(57) ABSTRACT

A display device including a display panel, a side surface electrode, and a flexible film. The display panel includes a display area, a non-display area defined outside the display area, a pixel disposed in the display area, a signal line connected to the pixel, and a connection pad extending from the signal line and disposed in the non-display area. The side surface electrode is disposed on one side surface of the display panel and contacts one side surface of the connection pad. The flexible film includes a driving pad that contacts the side surface electrode. The connection pad includes a first electrode layer including a plurality of first electrodes and a second electrode layer disposed on the first electrode layer and including a plurality of second electrodes. The first electrode layer and the second electrode layer have different rigidities.

20 Claims, 19 Drawing Sheets

(56) References Cited

U.S. PATENT DOCUMENTS

| | | | |
|---|---|---|---|
| 2018/0067354 A1* | 3/2018 | Son | H05K 1/189 |
| 2018/0088388 A1* | 3/2018 | Furuta | G02F 1/13452 |
| 2018/0114768 A1 | 4/2018 | Song et al. | |
| 2018/0174952 A1* | 6/2018 | Kim | H05K 1/111 |
| 2019/0049771 A1* | 2/2019 | Ye | G09G 3/3688 |
| 2019/0204652 A1* | 7/2019 | Lee | G02F 1/136286 |
| 2019/0206784 A1* | 7/2019 | Oh | G02F 1/13458 |
| 2019/0250449 A1* | 8/2019 | Son | H01L 24/05 |
| 2019/0278123 A1* | 9/2019 | Lee | G02F 1/13452 |
| 2020/0004093 A1* | 1/2020 | Yoo | H01L 27/3276 |

FOREIGN PATENT DOCUMENTS

| | | |
|---|---|---|
| KR | 10-2018-0023109 | 3/2018 |
| KR | 10-2018-0043872 | 5/2018 |
| KR | 10-2018-0070774 | 6/2018 |

* cited by examiner

DISPLAY DEVICE WITH SIDE SURFACE ELECTRODE AND METHOD OF MANUFACTURING THE SAME

CROSS-REFERENCE TO RELATED APPLICATION

This application claims priority from and the benefit of Korean Patent Application No. 10-2019-0088991, filed on Jul. 23, 2019, which is hereby incorporated by reference for all purposes as if fully set forth herein.

BACKGROUND

Field

Exemplary embodiments of the present invention relate to a display device and a method of manufacturing the same. More particularly, the exemplary embodiments relate to a display device having reduced bezel width and a method of manufacturing the display device.

Discussion of the Background

In general, a display device includes a display panel including pixels and a driving chip driving the pixels. The driving chip is disposed on a flexible film, and the flexible film is connected to the display panel. The driving chip is connected to the pixels of the display panel via the flexible film. This connection method is referred to as a "chip-on-film" method.

Pads connected to the driving chip are arranged on the flexible film, and the display panel includes connection pads connected to the pixels. As the pads make contact with the connection pads, respectively, the driving chip is connected to the pixels.

The pads may be connected to the connection pads in various ways. For example, the pads may be electrically connected to the connection pads by an anisotropic conductive film. In addition, the pads may be connected to the connection pads by an ultrasonic bonding method without using the anisotropic conductive film.

In recent years, a structure in which the flexible film is disposed at a side surface of the display panel is being researched to reduce the bezel width and to expand a display area of the display device.

The above information disclosed in this Background section is only for understanding of the background of the inventive concepts, and, therefore, it may contain information that does not constitute prior art.

SUMMARY

Exemplary embodiments of the present invention provide a display device having a reduced bezel width.

Exemplary embodiments of the present invention provide a method of manufacturing the display device.

Additional features of the inventive concepts will be set forth in the description which follows, and in part will be apparent from the description, or may be learned by practice of the inventive concepts.

An exemplary embodiment of the inventive concept provides a display device including a display panel, a side surface electrode, and a flexible film. The display panel includes a display area, a non-display area defined outside the display area, a pixel disposed in the display area, a signal line connected to the pixel, and a connection pad extending from the signal line and disposed in the non-display area. The side surface electrode is disposed on one side surface of the display panel and makes contact with one side surface of the connection pad. The flexible film includes a driving electrode that makes contact with the side surface electrode.

The connection pad may include a first electrode layer and a second electrode layer disposed on the first electrode layer. The first electrode layer may include a plurality of first electrodes extending in a first direction and disposed to be spaced apart from each other in a second direction crossing the first direction. The second electrode layer may include a plurality of second electrodes extending in the first direction and disposed to be spaced apart from each other in the second direction. The first electrode layer and the second electrode layer may have different rigidities.

The first electrode layer may include a first lower electrode layer and a first upper electrode layer disposed on the first lower electrode layer. The first electrodes may be included in at least one of the first lower electrode layer and the first upper electrode layer.

The connection pad may further include a first insulating interlayer disposed between the first lower electrode layer and the first upper electrode layer.

The first lower electrode layer may include a plurality of first lower electrodes and the first upper electrode layer may include a plurality of first upper electrodes. The first lower electrodes may extend in the first direction and may be spaced apart from each other in the second direction. The first upper electrodes extend in the first direction and are disposed to be spaced apart from each other in the second direction.

A side surface of the first lower electrodes and a side surface of the first upper electrodes may contact the side surface electrode.

The first lower electrodes and the first upper electrodes may include a same material.

The second electrode layer may include a second lower electrode layer and a second upper electrode layer disposed on the second lower electrode layer. The second electrodes may be included in at least one of the second lower electrode layer and the second upper electrode layer.

The connection pad may further include a second insulating interlayer disposed between the second lower electrode layer and the second upper electrode layer.

The second lower electrode layer may include a plurality of second lower electrodes, and the second upper electrode layer may include a plurality of second upper electrodes. The second lower electrodes may extend in the first direction and may be spaced apart from each other in the second direction, and the second upper electrodes may extend in the first direction and spaced apart from each other in the second direction.

A side surface of the second lower electrodes and a side surface of the second upper electrodes may contact the side surface electrode.

The second lower electrodes and the second upper electrodes may include a same material.

The first electrodes may be spaced apart from each other by a first distance in the second direction, and the second electrodes may be spaced apart from each other by a second distance in the second direction. The second distance may be less than the first distance.

The connection pad may have a concave-convex structure in the second direction due to a difference in rigidity between the first and second electrodes.

The side surface electrode may have a shape corresponding to the concave-convex structure at a contact portion where the side surface electrode makes contact with the connection pad.

The connection pad may further include a third insulating interlayer interposed between the first electrode layer and the second electrode layer.

The display panel may further include a base substrate, and one side surface of the base substrate may be aligned with a side surface of the third insulating interlayer.

A side surface of the first electrode layer may be inwardly recessed more than the one side surface of the base substrate and the side surface of the third insulating interlayer, and a side surface of the second electrode layer may be inwardly recessed more than the one side surface of the base substrate and the side surface of the third insulating interlayer.

The side surface of the second electrode layer may be recessed more than the side surface of the first electrode layer with respect to the one side surface of the base substrate.

Another exemplary embodiment of the inventive concept provides a method of manufacturing a display device including grinding one side surface of a display panel including a display area, a non-display area defined outside the display area, a pixel disposed in the display area, a signal line connected to the pixel, and a connection pad extending from the signal line and disposed in the non-display area, forming a side surface metal layer on the one side surface of the display panel, patterning the side surface metal layer into a plurality of side surface electrodes, disposing a flexible film to allow a plurality of driving pads to correspond to the side surface electrodes in a one-to-one correspondence, and electrically coupling the driving pads of the flexible film to the side surface electrodes, respectively, using an ultrasonic bonding method.

The connection pad may include a first electrode layer and a second electrode layer disposed on the first electrode layer. The first electrode layer may include a plurality of first electrodes extending in a first direction and spaced apart from each other in a second direction crossing the first direction. The second electrode layer may include a plurality of second electrodes extending in the first direction and spaced apart from each other in the second direction. The first electrode layer and the second electrode layer may have different rigidities.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
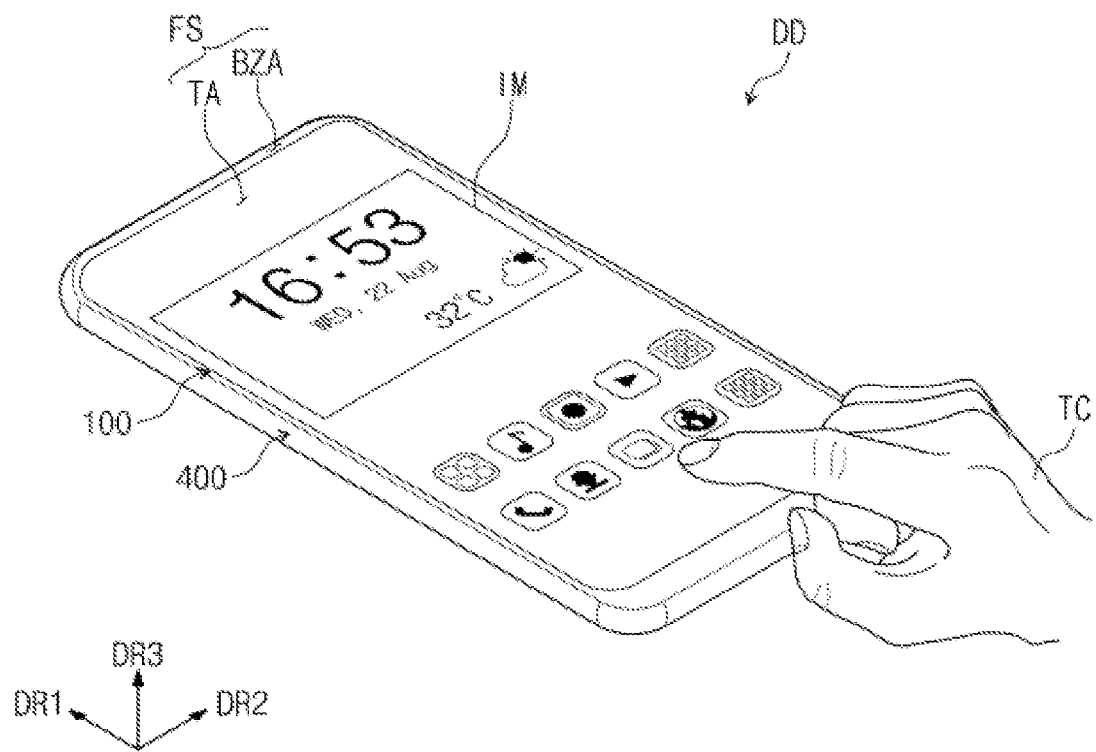
FIG. 1 is a perspective view showing a display device according to an exemplary embodiment of the present invention.

In the following description, for the purposes of explanation, numerous specific details are set forth in order to provide a thorough understanding of various exemplary embodiments of the invention. As used herein "embodiments are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, the present invention will be explained in detail with reference to the accompanying drawings.

Figure 2:
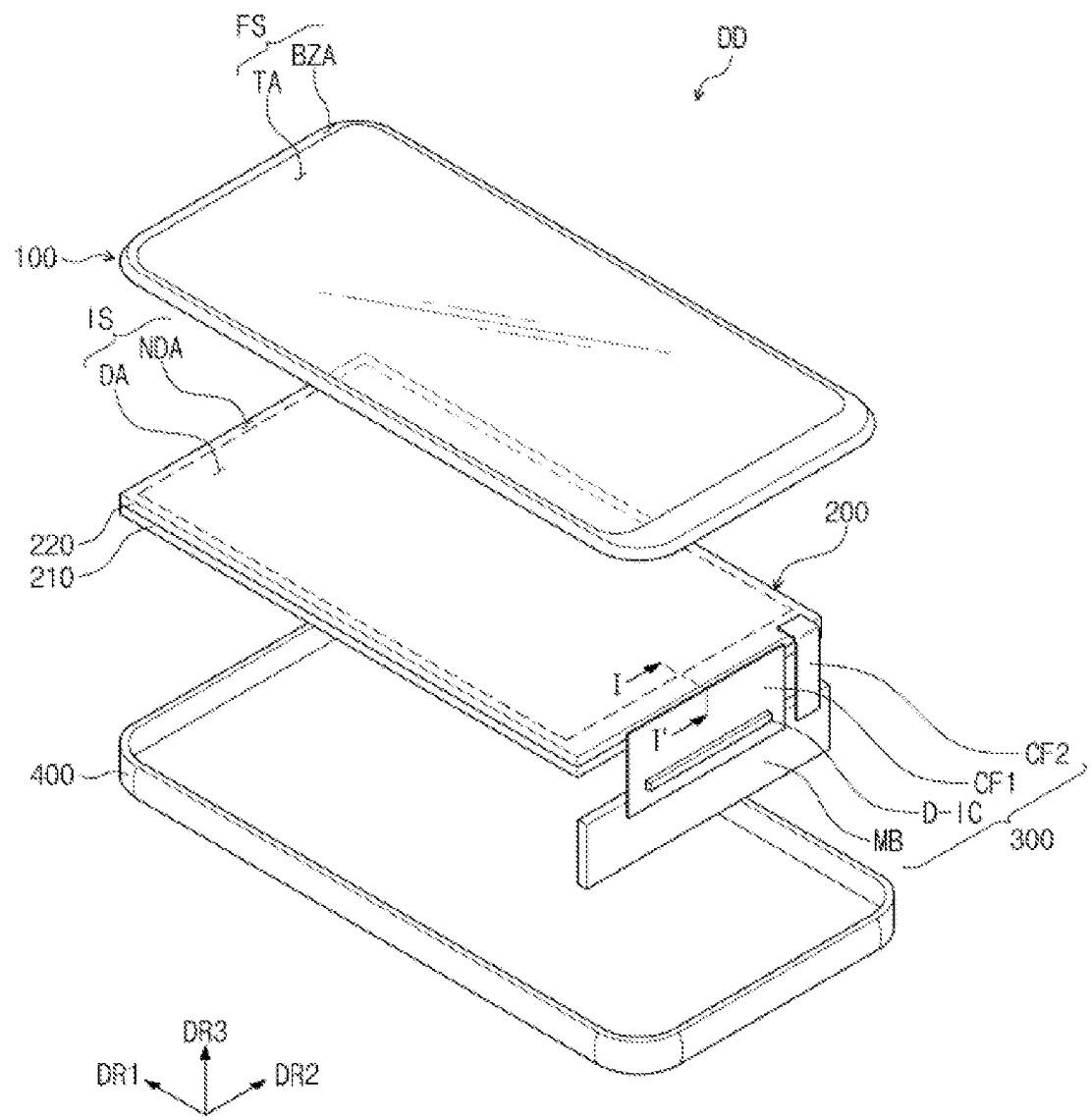
FIG. 2 is an exploded perspective view showing a display device according to an exemplary embodiment of the present invention.

FIG. 1 is a perspective view showing a display device DD according to an exemplary embodiment of the present invention, and FIG. 2 is an exploded perspective view showing the display device DD according to an exemplary embodiment of the present invention.

Referring to FIGS. 1 and 2, the display device DD may be activated in response to electrical signals to display an image. The display device DD may be a tablet computer, a notebook computer, a computer, or a television set. In the present exemplary embodiment, a smart phone will be described as a representative example of the display device DD.

The display device DD may display an image IM toward a third direction DR3 through a display surface FS substantially parallel to each of a first direction DR1 and a second direction DR2. The display surface FS through which the image IM is displayed may correspond to a front surface of the display device DD and a front surface of a window 100. Hereinafter, the front surface of the display device DD and the front surface of the window 100 will be referred to as the "display surface FS". The image IM includes a still image as well as a motion image. FIG. 1 shows a clock application and application icons as a representative example of the image IM.

In the present exemplary embodiment, front (or upper) and rear (or lower) surfaces of each member are defined with respect to a direction in which the image IM is displayed. The front and rear surfaces are opposite to each other in the third direction DR3, and a normal line direction of each of the front and rear surfaces is substantially parallel to the third direction DR3. Directions indicated by the first, second, and third directions DR1, DR2, and DR3 are relative to each other, and thus, the directions indicated by the first, second, and third directions DR1, DR2, and DR3 may be changed to other directions.

The display device DD includes the window 100, a display module 200, a driving circuit unit 300, and a housing 400. In the present exemplary embodiment, the window 100 and the housing 400 are coupled to each other to form an exterior of the display device DD.

The window 100 includes an optically transparent insulating material. For example, the window 100 includes glass or plastic. The window 100 has a single-layer or multi-layer structure. For example, the window 100 includes a plurality of plastic films attached to each other by an adhesive, or otherwise includes a glass substrate and a plastic film attached to the glass substrate by an adhesive.

The window 100 may be divided into a transmission area TA and a bezel area BZA when viewed in a plan view. In the present exemplary embodiment, the expression "when viewed in a plan view" may mean a state of being viewed in the third direction DR3. In addition, the expression "thickness direction" may mean the third direction DR3.

The transmission area TA may be an optically transparent area. The bezel area BZA may be an area having a light transmittance relatively lower than the transmission area TA. The bezel area BZA may define a shape of the transmission area TA. The bezel area BZA may be disposed adjacent to the transmission area TA and may surround the transmission area TA.

The bezel area BZA may have a predetermined color. The bezel area BZA may cover a non-display area NDA of the display module 200 to prevent the non-display area NDA from being observed from the outside.

As shown in FIG. 2, the display module 200 may be disposed under the window 100. In the present exemplary embodiment, the term "under" may mean a direction opposite to the direction in which the display module 200 displays the image IM. The display module 200 may display the image IM and may sense an external input TC. The display module 200 may include a front surface IS including a display area DA and the non-display area NDA. The display area DA may be an area that displays the image in response to electrical signals.

In the present exemplary embodiment, the display area DA may be the area in which the image IM is displayed and the external input TC is sensed. The transmission area TA may overlap at least the display area DA. For example, the transmission area TA may overlap at least a portion or entire surface of the display area DA. Therefore, the user may observe the image IM through the transmission area TA or may provide the external input TC through the transmission area TA.

The non-display area NDA may be covered by the bezel area BZA. The non-display area NDA may be disposed adjacent to the display area DA. The non-display area NDA may surround the display area DA. A driving circuit or a driving line may be disposed in the non-display area NDA to drive the display area DA.

A width of the bezel area BZA may be defined as a "bezel width". The decrease in bezel width of the display device DD having a given size may mean that a size of the transmission area TA increases. In addition, the decrease in bezel width may mean that a width of the non-display area NDA corresponding to the bezel area BZA decreases.

In the present exemplary embodiment, the display module 200 has a flat shape in the display area DA and the non-display area NDA, although the shape should not be limited thereto or thereby. For example, the display module 200 may be folded or bent.

The display module 200 includes a display panel 210 and an input sensing layer 220.

The display panel 210 may be configured to substantially generate the image IM. The image IM generated by the display panel 210 may be displayed through the front surface IS of the display module 200 and observed by the user from the outside through the transmission area TA.

The input sensing layer 220 senses the external input TC provided from the outside. For example, the input sensing layer 220 may sense the external input TC provided through the window 100. The external input TC may be a user input. The user input may include various forms of external inputs, such as a portion of the user's body, light, heat, pen, or pressure. In the present exemplary embodiment, the external input TC is shown as a touch operation using the user's hand applied via the display surface FS of the display device DD. However, this is merely exemplary. As described above, the external input TC may be provided in various forms, and the display device DD may sense the external input TC applied to a side or rear surface of the display device DD depending on a structure of the display device DD, although the external input TC should not be limited to any particular embodiment.

The driving circuit unit 300 may be electrically connected to the display panel 210 and the input sensing layer 220. The driving circuit unit 300 may include a main circuit board MB, a first flexible film CF1, a second flexible film CF2, and a driving chip D-IC.

The first flexible film CF1 is electrically connected to the display panel 210. The first flexible film CF1 connects the display panel 210 and the main circuit board MB. The first flexible film CF1 is connected to pads (connection pads) arranged on one side surface of the display module 200. The first flexible film CF1 provides electrical signals to the display panel 210 to drive the display panel 210. The electrical signals are generated by the first flexible film CF1 or the main circuit board MB.

The second flexible film CF2 is electrically connected to the input sensing layer 220. The second flexible film CF2 connects the input sensing layer 220 and the main circuit board MB. The second flexible film CF2 is connected to pads (sensing pads) of the input sensing layer 220, which are arranged in the non-display area NDA. The second flexible film CF2 provides electrical signals to the input sensing layer 220 to drive the input sensing layer 220. The electrical signals are generated by the second flexible film CF2 or the main circuit board MB.

The main circuit board MB may include various driving circuits used to drive the display module 200 or a connector used to supply a power. The first flexible film CF1 and the second flexible film CF2 may be connected to the main circuit board MB. According to the present exemplary embodiment, the display module 200 may be easily controlled by using one main circuit board MB. However, this is merely exemplary. In the display module 200 according to the exemplary embodiment of the present invention, the display panel 210 and the input sensing layer 220 may be connected to different main circuit boards, one of the first flexible film CF1 and the second flexible film CF2 may not be connected to the main circuit board MB, and they should not be limited to a particular embodiment. The main circuit board MB may be provided as a flexible printed circuit board.

According to the exemplary embodiment of the present invention, the driving circuit unit 300 is disposed on one side surface of the display module 200. However, the driving circuit unit 300 may be provided in a plural number, and the driving circuit units 300 may be disposed on at least one side surface of the display module 200.

The driving chip D-IC may be disposed on the first flexible film CF1. The driving chip D-IC may generate driving signals necessary for the operation of the display panel 210 of the present exemplary embodiment. The driving signals output from the driving chip D-IC may be applied to the display panel 210 through the first flexible film CF1.

The first flexible film CF1 may be bent toward a rear surface of the display panel 210 from the side surface of the display module 200. Accordingly, the driving chip D-IC and the main circuit board MB may be disposed on the rear surface of the display panel 210.

When compared with the display device in which the first flexible film CF1 is attached to the front surface of the display panel 210, the display device DD according to the present exemplary embodiment may secure a wider display area DA. That is, when the first flexible film CF1 is disposed in the non-display area NDA of the display panel 210, the non-display area NDA includes a bonding area to which the first flexible film CF1 is coupled. However, according to the present exemplary embodiment, the bonding area is removed from the non-display area NDA, and as a result, the bezel width may decrease, and the display area DA may increase by the decreased bezel width.

The housing 400 is coupled to the window 100. The housing 400 is coupled to the window 100 to provide an inner space. The display module 200 is accommodated in the inner space.

The housing 400 may include a material with a relatively high rigidity. For example, the housing 400 may include a plurality of frames and/or plates containing glass, plastic, metal, or a combination thereof. The housing 400 may stably protect the components of the display device DD, which are accommodated in the inner space, from external impacts.

Figure 3:
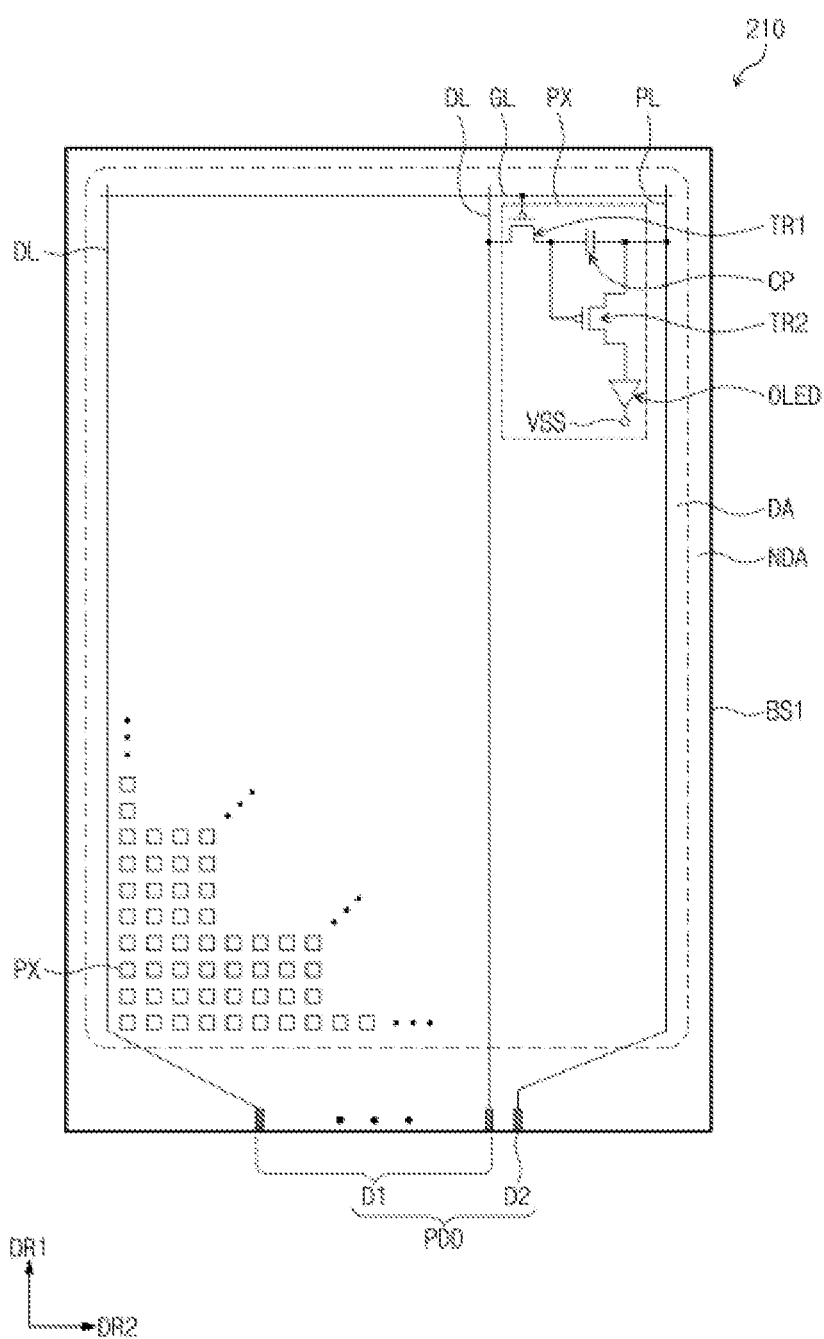
FIG. 3 is a plan view showing a display panel according to an exemplary embodiment of the present invention.
Figure 4:
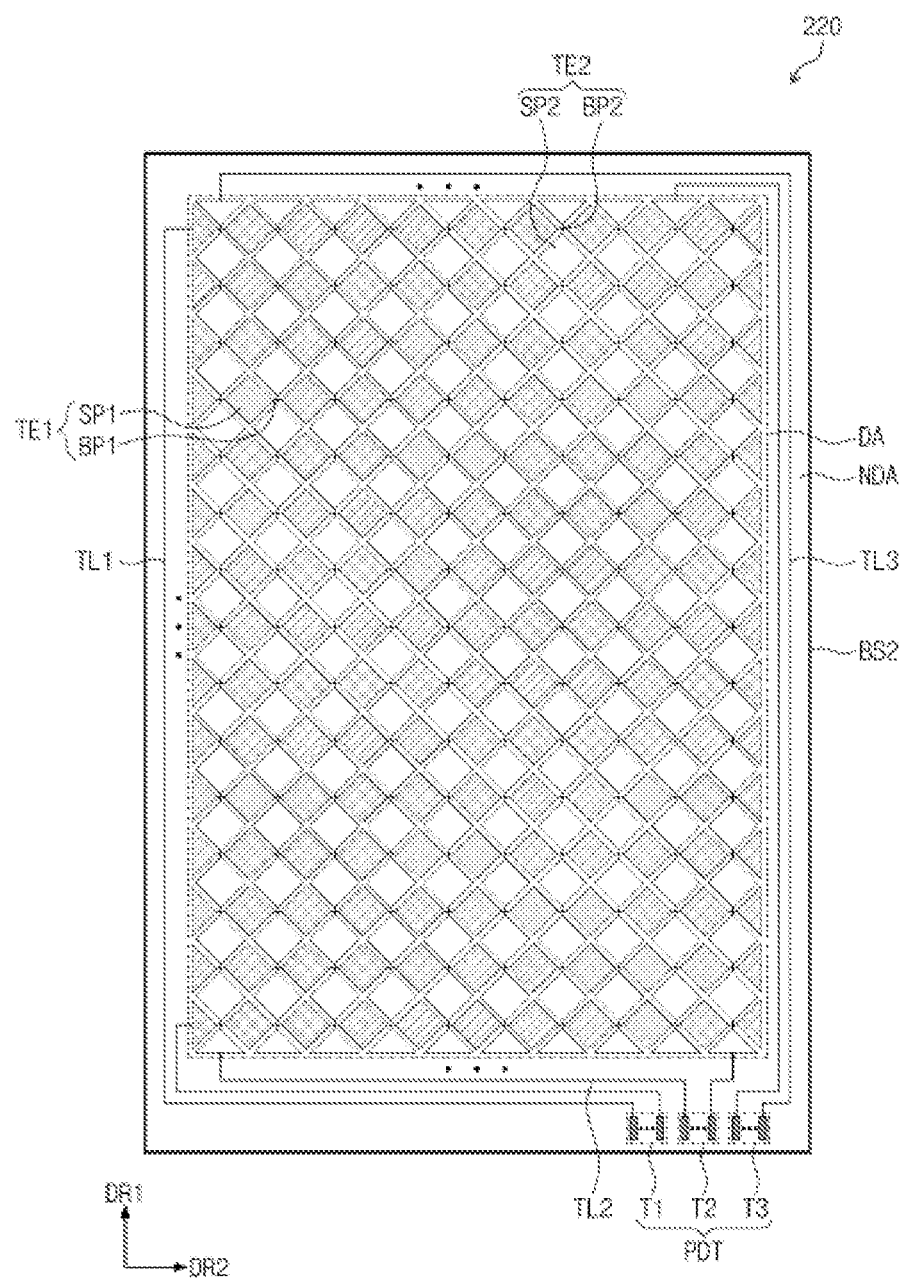
FIG. 4 is a plan view showing an input sensing layer according to an exemplary embodiment of the present invention.

FIG. 3 is a plan view showing the display panel 210 according to an exemplary embodiment of the present invention, and FIG. 4 is a plan view showing the input sensing layer 220 according to an exemplary embodiment of the present invention.

Referring to FIG. 3, the display panel 210 includes a first base substrate BS1, a plurality of pixels PX, a plurality of signal lines GL, DL, and PL, and a plurality of connection pads PDD.

The display area DA of the display panel 210 is an area in which the image IM is displayed, and the non-display area NDA is another area in which the driving circuit or the driving line is disposed. FIG. 3 shows the display area DA and the non-display area NDA of the display panel 210. The pixels PX are disposed in the display area DA.

The first base substrate BS1 may be a stack structure including a silicon substrate, a plastic substrate, a glass substrate, an insulating film, or a plurality of insulating layers.

The signal lines GL, DL, and PL are connected to the pixels PX to apply electrical signals to the pixels PX. Among signal lines included in the display panel 210, a scan line GL, a data line DL, and a power line PL are shown in FIG. 3 as a representative example. However, this is merely exemplary. That is, the signal lines GL, DL, and PL may further include at least one of an initialization voltage line and a light emitting control line and should not be particularly limited. The signal lines GL, DL, and PL may be disposed on the display area DA of the first base substrate BS1.

In the present exemplary embodiment, an equivalent circuit diagram of one pixel PX among the pixels PX is enlarged and shown as a representative example. The pixel PX may include a first transistor TR1, a capacitor CP, a second transistor TR2, and a light-emitting diode OLED. The first transistor TR1 may be a switching device that controls an ON/OFF of the pixel PX. The first transistor TR1 may transmit or block a data signal applied thereto through the data line DL in response to a scan signal applied thereto through the scan line GL.

The capacitor CP is connected to the first transistor TR1 and the power line PL. The capacitor CP is charged with electric charges corresponding to a difference between the data signal provided from the first transistor TR1 and a first power signal applied to the power line PL.

The second transistor TR2 is connected to the first transistor TR1, the capacitor CP, and the light-emitting diode OLED. The second transistor TR2 controls a driving current flowing through the light-emitting diode OLED in response to an amount of the electric charges charged in the capacitor CP. A turn-on time of the second transistor TR2 is determined by the amount of the electric charges charged in the capacitor CP. The second transistor TR2 applies the first power signal provided through the power line PL to the light-emitting diode OLED during its turn-on time.

The light-emitting diode OLED may generate light or may control an amount of light in response to the electrical signals. For example, the light-emitting diode OLED may include an organic light-emitting diode or a quantum dot light-emitting diode.

The light-emitting diode OLED is connected to a power terminal VSS to receive a power signal (hereinafter, referred to as "second power signal") different from the first power signal provided through the power line PL. The driving current corresponding to a difference between the electrical signals provided from the second transistor TR2 and the second power signal flows through the light-emitting diode OLED, and the light-emitting diode OLED generates the light corresponding to the driving current. However, this is merely exemplary. That is, the pixel PX may include electronic devices having various configurations and arrangements and should not be particularly limited.

The connection pads PDD may include first connection pads D1 and a second connection pad D2. The first connection pads D1 may be provided in a plural number and may be connected to the data lines DL. The second connection pad D2 may be electrically connected to the power line PL. The display panel 210 may apply the electrical signals provided thereto from the outside through the connection pads PDD to the pixels PX. Meanwhile, the connection pads PDD may further include pads to receive other electrical signals in addition to the first connection pads D1 and the second connection pad D2. However, the connection pads PDD should not be limited thereto or thereby. The connection pads PDD may be disposed in the non-display area NDA. One side surfaces of the connection pads PDD may be exposed to the outside to be electrically connected to the driving circuit unit 300. That is, the connection pads PDD may extend to an edge at which an upper surface and a side surface of the first base substrate BS1 are connected to each other, and the one side surfaces of the connection pads PDD are disposed at the same position as the side surface of the first base substrate BS1 to be exposed to the outside.

Referring to FIGS. 2 and 4, the input sensing layer 220 may be disposed on the display panel 210. For example, the input sensing layer 220 may be directly disposed on the display panel 210 or may be coupled to the display panel 210 by an adhesive member. When the input sensing layer 220 may be directly disposed on the display panel 210, the input sensing layer 220 may be formed on the display panel 210 through successive processes after the display panel 210 is formed.

The input sensing layer 220 may include a first sensing electrode TE1, a second sensing electrode TE2, a plurality of sensing lines TL1, TL2, and TL3, and a plurality of sensing pads PDT.

The first sensing electrode TE1 and the second sensing electrode TE2 are disposed in the display area DA. The input sensing layer 220 may secure information on the external input TC (refer to FIG. 1) based on a variation in capacitance between the first sensing electrode TE1 and the second sensing electrode TE2.

The first sensing electrode TE1 includes first sensing patterns SP1 and first connection patterns BP1. At least one first connection pattern BP1 is connected to two first sensing patterns SP1 adjacent to each other. The second sensing electrode TE2 includes second sensing patterns SP2 and second connection patterns BP2. At least one second connection pattern BP2 is connected to two second sensing patterns SP2 adjacent to each other.

The sensing lines TL1, TL2, and TL3 are disposed in the non-display area NDA. The sensing lines TL1, TL2, and TL3 include a first sensing line TL1, a second sensing line TL2, and a third sensing line TL3.

The first sensing line TL1 is connected to the first sensing electrode TE1. The second sensing line TL2 is connected to one end of the second sensing electrode TE2. The third sensing line TL3 is connected to the other end of the second sensing electrode TE2. The other end of the second sensing electrode TE2 is opposite to the one end of the second sensing electrode TE2.

According to the present exemplary embodiment, the second sensing electrode TE2 is connected to the second sensing line TL2 and the third sensing line TL3. Accordingly, sensitivity with respect to an area of the second sensing electrode TE2, which has a longer length than the first sensing electrode TE1, may be uniformly maintained. However, this is merely exemplary. According to an exemplary embodiment, the third sensing line TL3 may be omitted and the inventive concepts should not be particularly limited.

The sensing pads PDT are disposed in the non-display area NDA. The sensing pads PDT include a first sensing pad T1, a second sensing pad T2, and a third sensing pad T3. The first sensing pad T1 is connected to the first sensing line TL1 and electrically connected to the first sensing electrode TE1. The second sensing pad T2 is connected to the second sensing line TL2, and the third sensing pad T3 is connected to the third sensing line TL3. Therefore, the second sensing pad T2 and the third sensing pad T3 are electrically connected to the second sensing electrode TE2.

The sensing pads PDT may be bonded to the second flexible film CF2 (refer to FIG. 2) in the non-display area NDA. FIGS. 2 and 4 show a structure in which the second flexible film CF2 is bonded to the front surface of the input sensing layer 220. However, the inventive concepts should not be limited thereto or thereby. That is, according to another exemplary embodiment, the second flexible film CF2 may be bonded to the one side surface of the display module 200 to apply signals to the input sensing layer 220 to drive the input sensing layer 220. The one side surface of the display module 200 may be substantially the same as the one side surface to which the first flexible film CF1 is bonded to the display panel 210.

Figure 5:
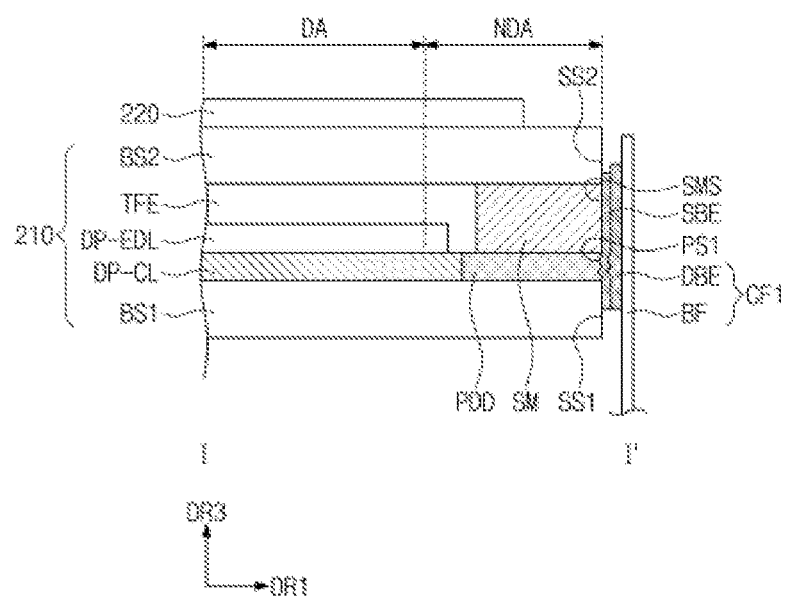
FIG. 5 is a cross-sectional view taken along a line I-I' shown in FIG. 2.

FIG. 5 is a cross-sectional view taken along a line I-I' shown in FIG. 2.

Referring to FIG. 5, the display panel 210 includes the first base substrate BS1, a circuit element layer DP-CL, a light emitting element layer DP-EDL, a thin film encapsulation layer TFE, a second base substrate BS2, and a sealant SM. According to an exemplary embodiment, the first base substrate BS1, the circuit element layer DP-CL, the light emitting element layer DP-EDL, and the thin film encapsulation layer TFE may be sequentially stacked in the third direction DR3.

The first base substrate BS1 may be a member that provides a base surface on which the circuit element layer DP-CL is disposed. The first base substrate BS1 may be a glass substrate, a metal substrate, or a plastic substrate. However, the composition of the first base substrate BS1 should not be limited thereto. The first base substrate BS1 may be an inorganic layer, an organic layer, or a composite material layer.

The circuit element layer DP-CL is disposed on the first base substrate BS1. The circuit element layer DP-CL includes elements used to drive the pixel PX (refer to FIG. 3), i.e., transistors TR1 and TR2 (refer to FIG. 3) and the capacitor CP (refer to FIG. 3).

The light emitting element layer DP-EDL is disposed on the circuit element layer DP-CL. The light emitting element layer DP-EDL includes a plurality of light-emitting diodes OLED (refer to FIG. 3)

The thin film encapsulation layer TFE may be disposed on the light emitting element layer DP-EDL to encapsulate the light-emitting diode OLED. The thin film encapsulation layer TFE may entirely cover the display area DA. The thin film encapsulation layer TFE may cover a portion of the non-display area NDA.

The thin film encapsulation layer TFE may include a first inorganic layer, an organic layer, and a second inorganic layer, which are sequentially stacked in the third direction DR3. Each of the first inorganic layer, the organic layer, and the second inorganic layer may have a single-layer or multi-layer structure. In addition, at least one of the first inorganic layer, the organic layer, and the second inorganic layer may be provided in a plural number or may be omitted, and they should not be limited thereto.

The second base substrate BS2 is disposed to face the first base substrate BS1. The second base substrate BS2 may be a glass substrate, a metal substrate, or a plastic substrate. As an example of the present exemplary embodiment, the first and second base substrates BS1 and BS2 may include substantially the same material. However, the inventive concepts should not be limited thereto or thereby. That is, the second base substrate BS2 may be an inorganic layer, an organic layer, or a composite material layer.

The second base substrate BS2 may be coupled to the first base substrate BS1 by the sealant SM, and a space between the first and second substrates BS1 and BS2 may be sealed by the sealant SM. The sealant SM may include an organic adhesive member or an inorganic adhesive member. The sealant SM may include a frit.

The input sensing layer 220 may be disposed on the second base substrate BS2.

The display panel 210 may include the connection pads PDD extending from the circuit element layer DP-CL and disposed in the non-display area NDA. The connection pads PDD may extend in the first direction DR1, and one ends of the connection pads PDD may be aligned with a side surface SS1 of the first base substrate BS1. The other ends of the connection pads PDD may be connected to the signal lines DL and PL (refer to FIG. 3). In addition, a side surface PS1 of each connection pad PDD may be more recessed than the side surface SS1 of the first base substrate BS1. Accordingly, the side surface PS1 of the each connection pad PDD may have a concave-convex structure.

The first base substrate BS1 includes an upper surface, a lower surface, and side surfaces SS1 connecting the upper surface and the lower surface. In this case, the side surface SS1 of the first base substrate BS1 will be described as being adjacent to the connection pads PDD.

A plurality of side surface electrodes SBE may be disposed on the side surface of the display panel 210. The side surface electrodes SBE may be disposed to correspond to the connection pads PDD in a one-to-one correspondence. Each side surface electrode SBE may directly make contact with the side surface PS1 of the corresponding connection pad PDD. Therefore, each side surface electrode SBE may be electrically connected to the corresponding connection pad PDD. The concave-convex structure formed on the side surface PS1 of the connection pads PDD may be reflected on the side surface electrodes SBE. That is, the side surface electrodes SBE may have the concave-convex structure in a portion corresponding to the side surface PS1 of the connection pads PDD.

Each side surface electrode SBE may be disposed on the side surface SS1 of the first base substrate BS1, a side surface SMS of the sealant SM, and a side surface SS2 of the second base substrate BS2. As an example of the present exemplary embodiment, the side surface SS1 of the first base substrate BS1, the side surface SMS of the sealant SM, and the side surface SS2 of the second base substrate BS2 may be aligned with the side surface PS1 of the connection pad PDD. Each side surface electrode SBE may partially cover the side surface SS1 of the first base substrate BS1 and the side surface SMS of the sealant SM, which are aligned with the side surface PS1 of the connection pad PDD. In addition, as another example, each side surface electrode SBE may further cover the side surface SS2 of the second base substrate BS2, which is aligned with the side surface PS1 of the connection pad PDD.

The side surface electrodes SBE may include a metal material containing copper (Cu), silver (Ag), gold (Au), or aluminum (Al). The side surface electrodes SBE may be formed on the side surface of the display panel 210 by a method of forming an electrode using a laser beam after depositing the metal material or a silk-screen method.

The first flexible film CF1 is attached to the side surface of the display panel 210. The first flexible film CF1 includes a base film BF and a plurality of driving electrodes DBE disposed on one surface of the base film BF. The first flexible film CF1 is disposed to allow the driving electrodes DBE to face a plurality of the side surface electrodes SBE and is bonded to the display panel 210. The driving electrodes DBE may be disposed to correspond to the side surface electrodes SBE in a one-to-one correspondence.

After the bonding process, each driving electrode DBE may directly make contact with the corresponding side surface electrode SBE. As an example of the present exemplary embodiment, the driving electrodes DBE may be directly connected to the side surface electrodes SBE by an ultrasonic bonding method. Thus, each driving electrode DBE may transmit the driving signal provided from the driving chip D-IC (refer to FIG. 2) to the corresponding side surface electrode SBE.

Figure 6A:
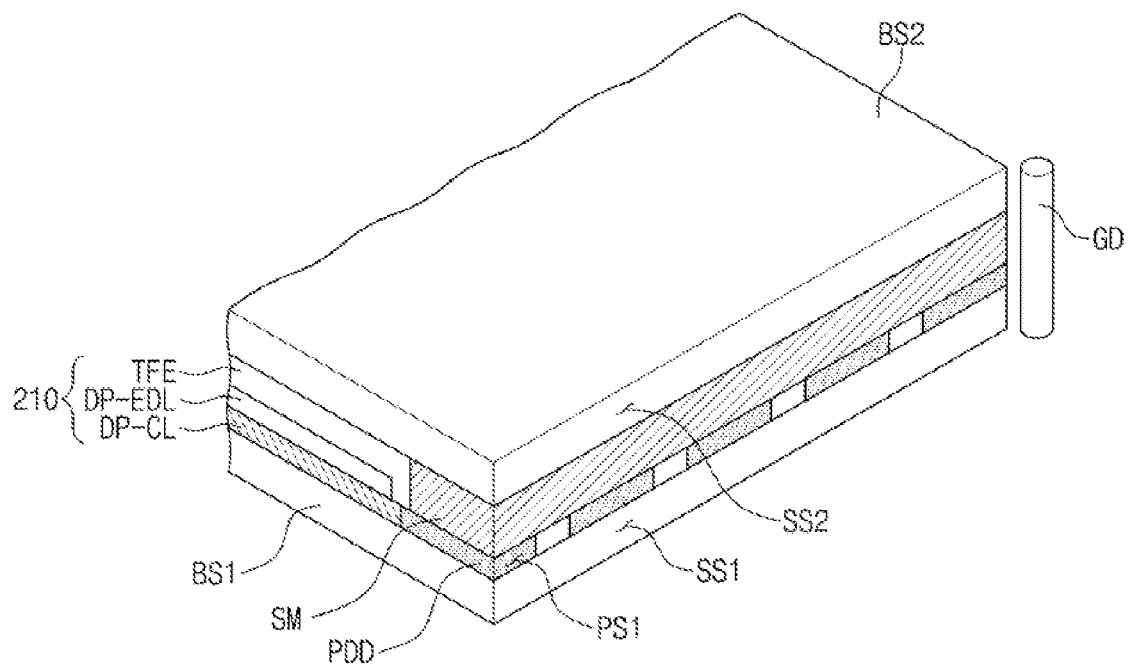
FIG. 6A, FIG. 6B, FIG. 6C, FIG. 6D, and FIG. 6E are process views showing a bonding process of a first flexible film.
Figure 6B:
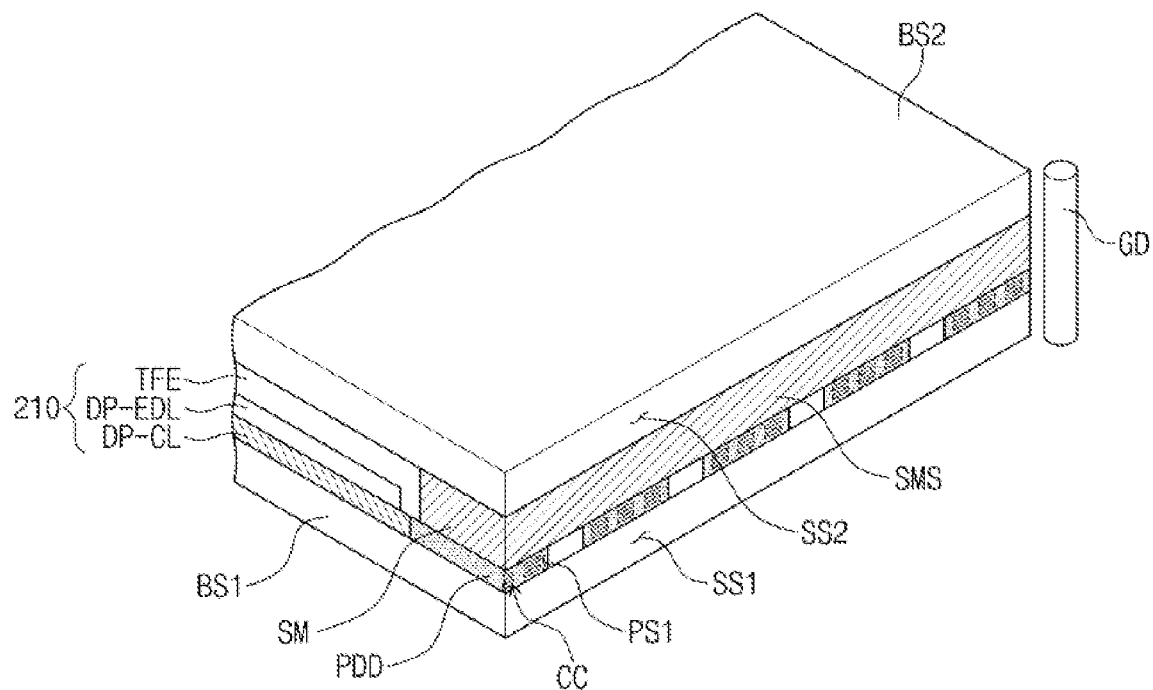
Figure 6B:
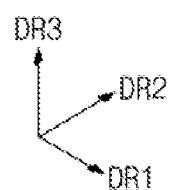
Figure 6C:
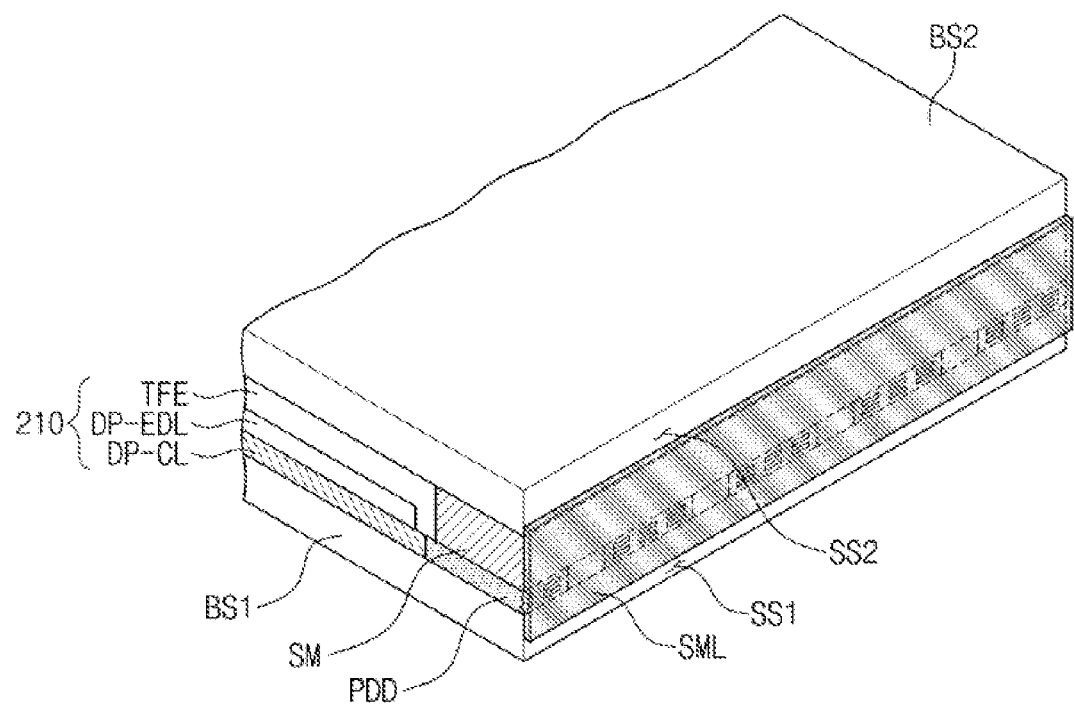
Figure 6D:
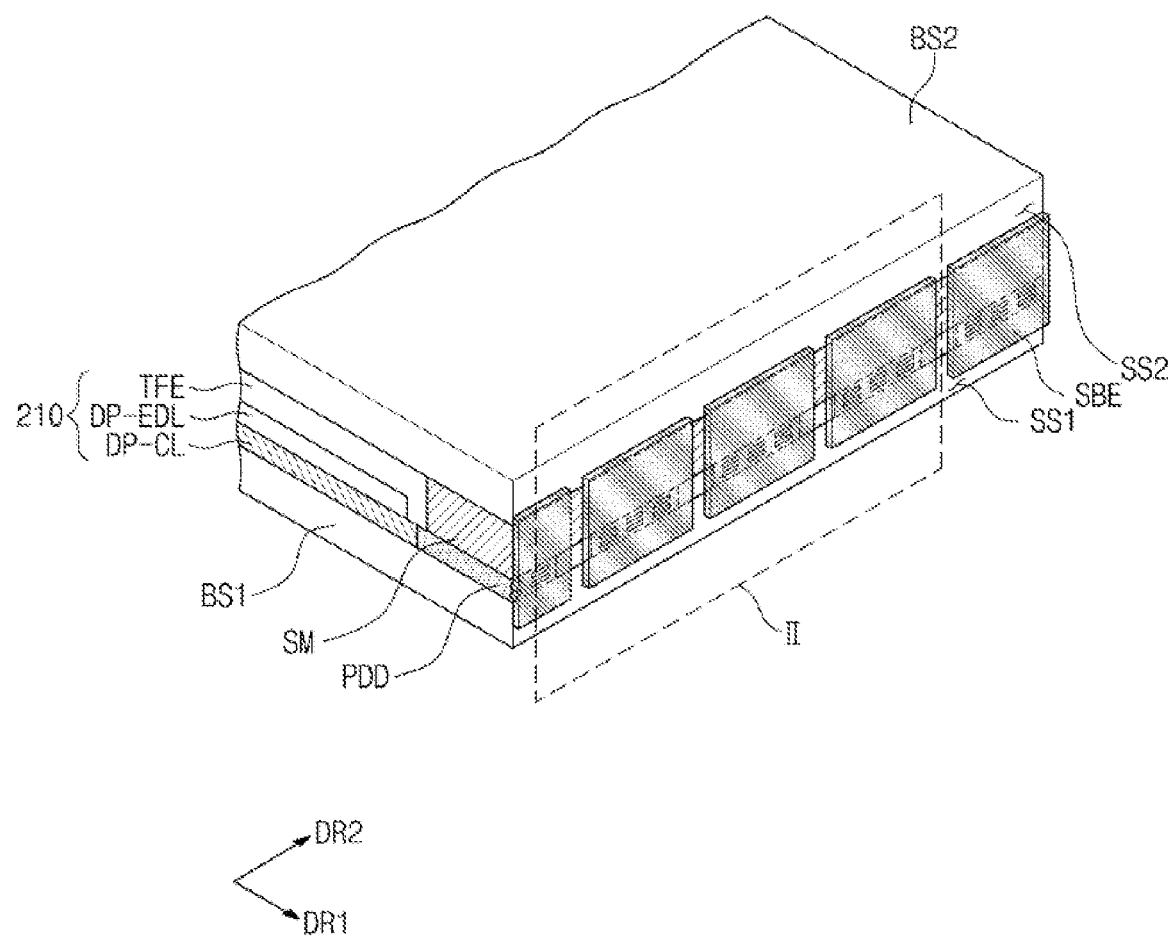
Figure 6E:
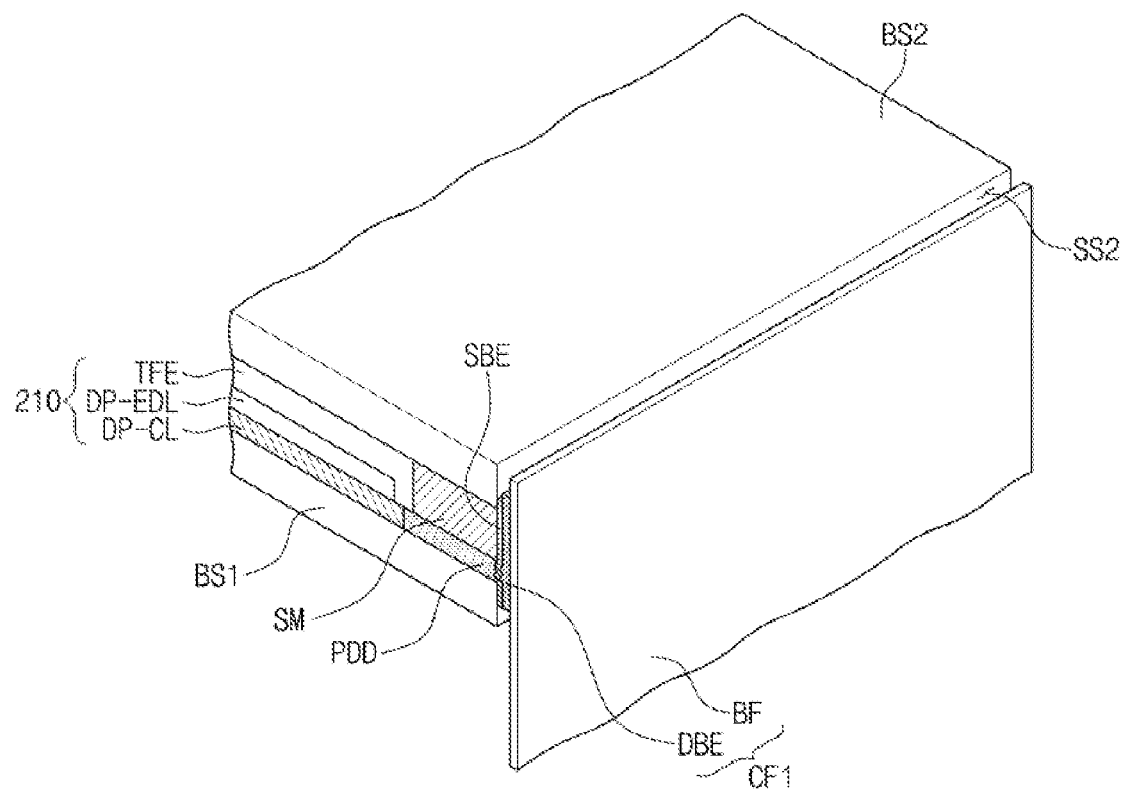
Figure 7:
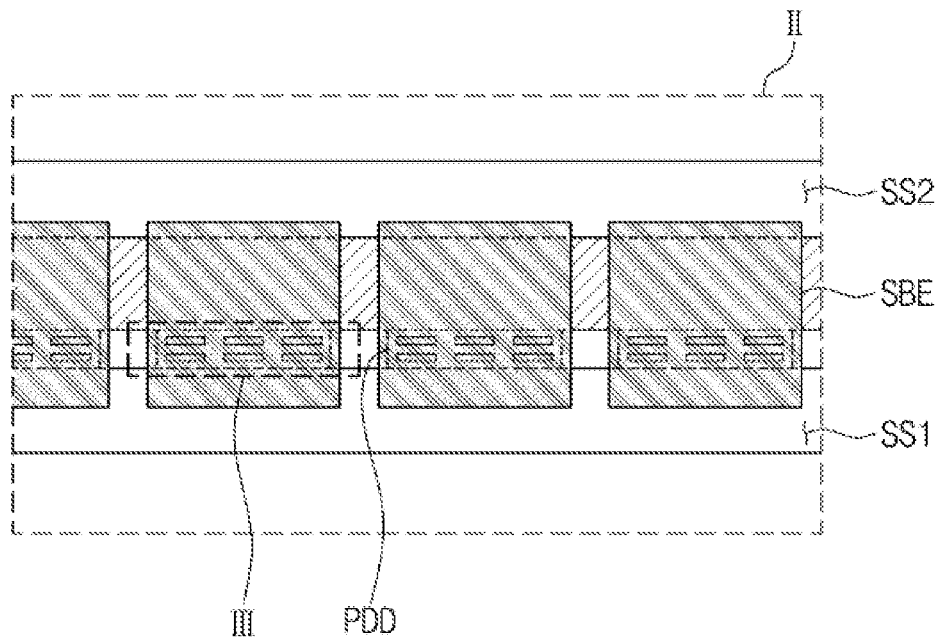
FIG. 7 is a side view showing a portion II shown in FIG. 6D.

FIGS. 6A to 6E are process views showing a bonding process of the first flexible film, and FIG. 7 is a side view showing a portion II shown in FIG. 6D.

Referring to FIGS. 5 and 6A, a process of grinding one side surface of the display panel 210 is performed before the side surface electrodes SBE are formed on the one side surface of the display panel 210.

A grinding device GD may be disposed on the one side surface of the display panel 210. The grinding device GD may include a rotational shaft and a grinding wheel rotating about the rotational shaft. The grinding wheel is rotated by the rotational shaft and grinds the one side surface of the display panel 210. In the present exemplary embodiment, the one side surface of the display panel 210 may include the side surface SS1 of the first base substrate BS1, the side surface PS1 of the connection pads PDD, the side surface SMS of the sealant SM, and the side surface SS2 of the second base substrate BS2.

As shown in FIG. 6B, a plurality of concave-convex portions CC may be formed on the side surface PS1 of the connection pads PDD by the grinding process. That is, the concave-convex portions CC may be formed on the side surface PS1 of the connection pads PDD aligned with the first base substrate BS1. As an example of the present exemplary embodiment, the concave-convex portions CC may be disposed to be spaced apart from each other in the second and third directions DR2 and DR3.

In a case where each connection pad PDD includes a plurality of metal layers having different rigidities, the metal layers may be ground at different grinding rates in the grinding process. For example, the metal layer having a relatively high rigidity has a relatively low grinding rate as compared with the metal layer having a relatively low rigidity. The difference in grinding rate may be reflected on the side surface PS1 of the connection pads PDD as the concave-convex portions CC. The structure of the connection pads PDD will be described in detail with reference to FIGS. 8 to 12.

Referring to FIG. 6C, a side surface metal layer SML may be deposited on the side surface of the display panel 210. The side surface metal layer SML may be formed to cover the side surface PS1 of the connection pads PDD. The side surface metal layer SML may partially overlap the side surface SS1 of the first base substrate BS1, the side surface SMS (refer to FIG. 6B) of the sealant SM, and the side surface SS2 of the second base substrate BS2.

The side surface metal layer SML may include a metal material containing copper (Cu), silver (Ag), gold (Au), or aluminum (Al).

Then, the side surface metal layer SML is partially removed by a laser process. Accordingly, as shown in FIGS. 6D and 7, the side surface electrodes SBE may be formed on the side surface of the display panel 210. The side surface electrodes SBE may be formed to correspond to the connection pads PDD in a one-to-one correspondence. The side surface electrodes SBE may be directly formed on the side surface PS1 (refer to FIG. 6B) of the connection pads PDD. Therefore, the concave-convex portions CC (refer to FIG. 6B) formed on the side surface PS1 of the connection pads PDD are reflected on the side surface electrodes SBE, and as a result, the side surface electrodes SBE may have the concave-convex structure in the portion (hereinafter, referred to as a "contact portion") that makes contact with the side surface PS1 of the connection pads PDD.

The connection pads PDD may be arranged to be spaced apart from each other in the second direction DR2 and may be electrically insulated from each other. In addition, the side surface electrodes SBE may be arranged to be spaced apart from each other in the second direction DR2 and may be electrically insulated from each other.

Referring to FIG. 6E, the first flexible film CF1 is attached to the side surface of the display panel 210 by the ultrasonic bonding method. The first flexible film CF1 includes the base film BF and the driving electrodes DBE disposed on the one surface of the base film BF.

When the first flexible film CF1 is disposed on the side surface of the display panel 210 to allow the driving electrodes DBE to face the side surface electrodes SBE, the ultrasonic bonding process is carried out. The ultrasonic bonding method may be carried out by an ultrasonic vibration device. The ultrasonic vibration device may generate a vibration at a predetermined frequency. For example, the ultrasonic vibration device may generate the ultrasonic vibration at a frequency of about 35 kHz. The ultrasonic vibration may be applied to the driving electrodes DBE via the base film BF.

Due to the ultrasonic vibration, a friction heat is generated at the surface at which the driving electrodes DBE make contact with the side surface electrodes SBE. The contact surface between the driving electrodes DBE and the side surface electrodes SBE is melted due to the friction heat, and as a result, a metal diffusion occurs. Therefore, the driving electrodes DBE and the side surface electrodes SBE may be coupled to each other. This bonding method may be defined as the "ultrasonic bonding method".

As shown in FIGS. 6D to 7, the surface of the side surface electrodes SBE has the concave-convex structure in the contact portion. In the portion formed with the concave-convex structure, a greater amount of friction heat may be generated during the ultrasonic bonding process. The increase in the friction heat may result in more metal diffusion between the driving electrodes DBE and the side surface electrodes SBE, and when the metal diffusion takes place a lot more, a coupling force between the driving electrodes DBE and the side surface electrodes SBE may increase. Therefore, the coupling force and electrical connection characteristics between the display panel 210 and the first flexible film CF1 may be improved.

Figure 8:
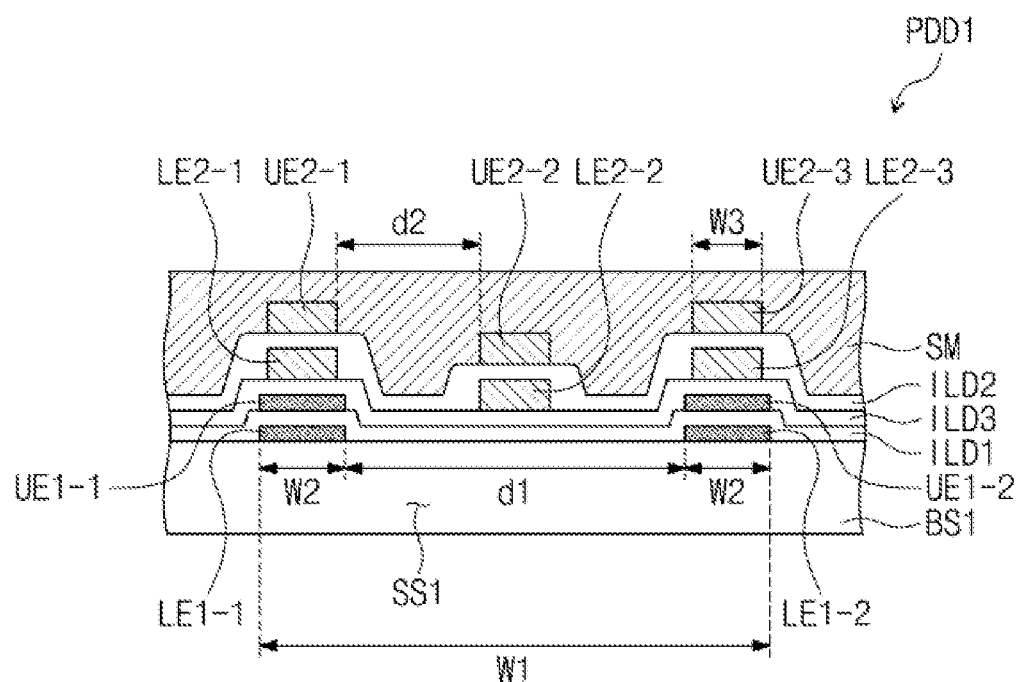
FIG. 8 is an enlarged view showing a side surface of a connection pad in a portion III shown in FIG. 7.
Figure 8:
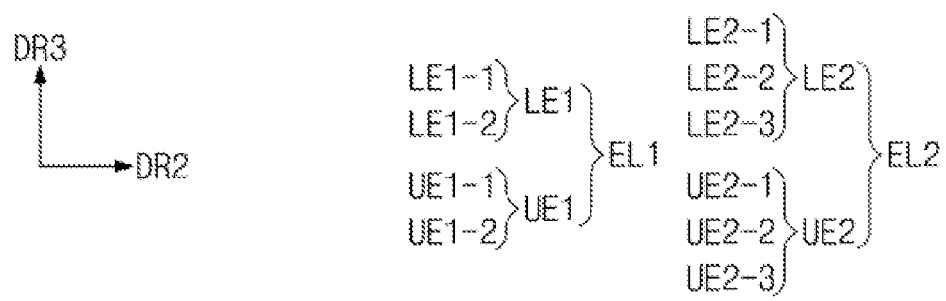
Figure 9:
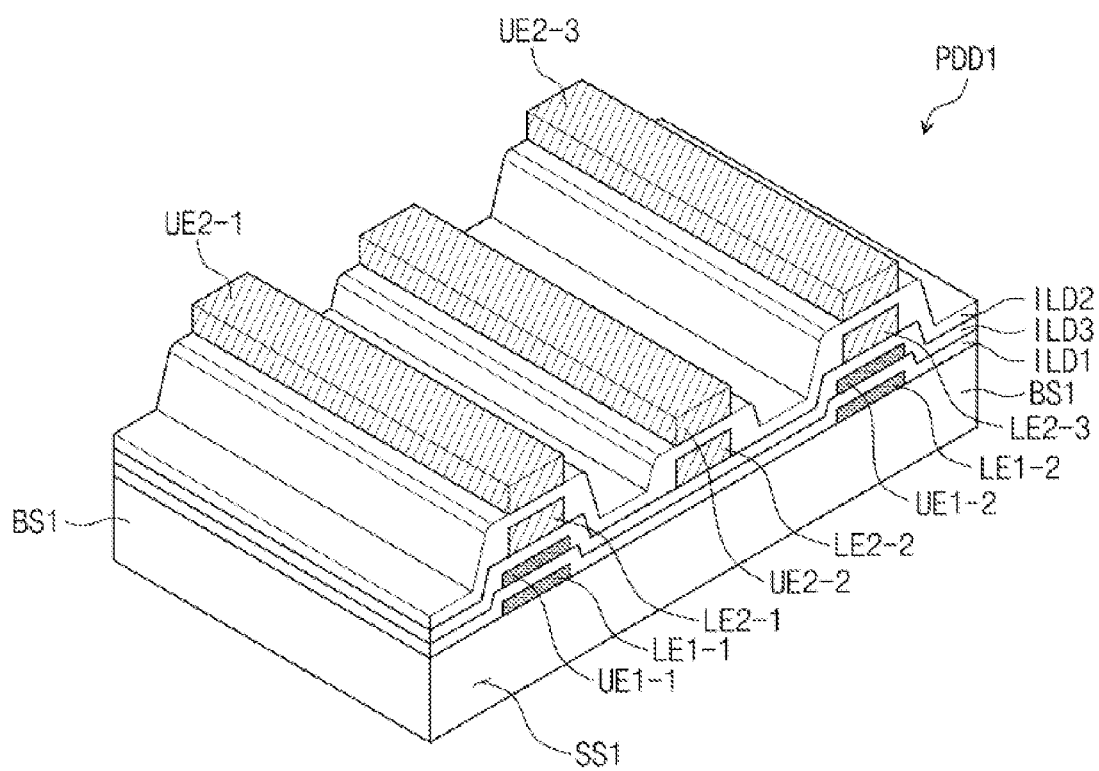
FIG. 9 is a perspective view showing the connection pad shown in FIG. 8.
Figure 9:
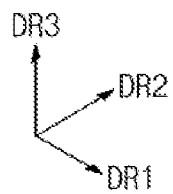
Figure 10:
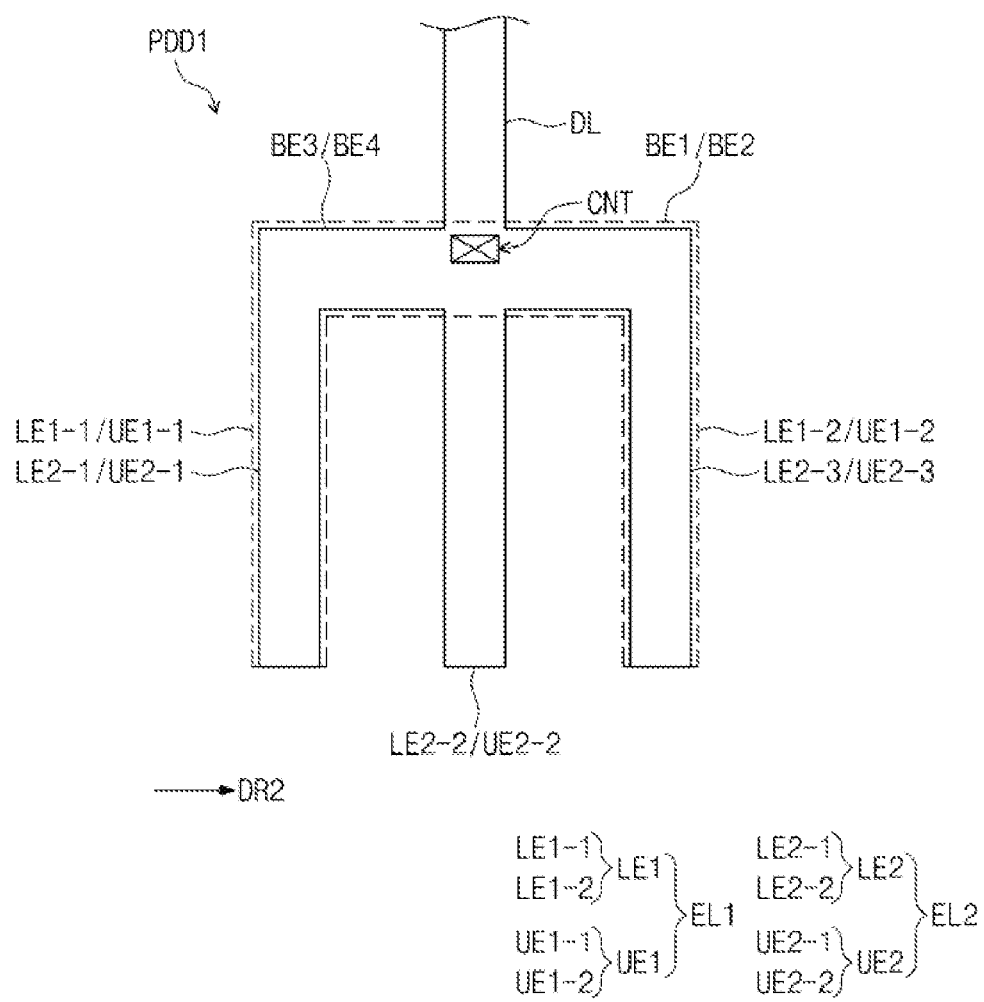
FIG. 10 is a plan view showing the connection pad shown in FIG. 9.

FIG. 8 is an enlarged view showing a side surface of a connection pad in a portion III shown in FIG. 7. FIG. 9 is a perspective view showing the connection pad shown in FIG. 8. FIG. 10 is a plan view showing the connection pad shown in FIG. 9. FIGS. 8 to 10 show one connection pad PDD1 among the connection pads PDD. Since the connection pads PDD have substantially the same structure, one connection pad PDD1 is described as a representative example, and details of others will be omitted.

Referring to FIGS. 8 to 10, the connection pad PDD1 is disposed on the upper surface of the first base substrate BS1. The connection pad PDD1 includes a first electrode layer EL1 and a second electrode layer EL2. As an example of the present exemplary embodiment, the first electrode layer EL1 includes a first lower electrode layer LE1 and a first upper electrode layer UE1 disposed on the first lower electrode layer LE1. The second electrode layer EL2 includes a second lower electrode layer LE2 and a second upper electrode layer UE2 disposed on the second lower electrode layer LE2.

The first lower electrode layer LE1 may include a plurality of first lower electrodes LE1-1 and LE1-2, and the first upper electrode layer UE1 may include a plurality of first upper electrodes UE1-1 and UE1-2. Each of the first lower electrodes LE1-1 and LE1-2 may extend in the first direction DR1. In addition, the first lower electrodes LE1-1 and LE1-2 may be disposed to be spaced apart from each other in the second direction DR2. Each of the first upper electrodes UE1-1 and UE1-2 may extend in the first direction DR1. In addition, the first upper electrodes UE1-1 and UE1-2 may be spaced apart from each other in the second direction DR2. As an example of the present exemplary embodiment, the first lower electrodes LE1-1 and LE1-2 may be spaced apart from each other by a first distance d1 in the second direction DR2, and the first upper electrodes UE1-1 and UE1-2 may be spaced apart from each other by the first distance d1 in the second direction DR2.

As an example of the present exemplary embodiment, the first lower electrode layer LE1 includes two first lower electrodes LE1-1 and LE1-2 and the first upper electrode layer UE1 includes two first upper electrodes UE1-1 and UE1-2. However, the inventive concepts should not be limited thereto or thereby. In addition, the first electrode layer EL1 includes two electrode layers of the first lower electrode layer LE1 and the first upper electrode layer UE1. However, the number of the electrode layers included in the first electrode layer EL1 should not be limited thereto or thereby. That is, the first electrode layer EL1 may include one, three, or four electrode layers.

The first lower electrode layer LE1 and the first upper electrode layer UE1 may include substantially the same material. As an example of the present exemplary embodiment, the first lower electrode layer LE1 and the first upper electrode layer UE1 may include molybdenum or an alloy thereof. As another example of the present exemplary embodiment, the first lower electrode layer LE1 and the first upper electrode layer UE1 may include different materials.

The connection pad PDD1 may further include a first insulating interlayer ILD1 disposed between the first lower electrode layer LE1 and the first upper electrode layer UE1. The first insulating interlayer ILD1 may include an inorganic material. The first lower electrode layer LE1 and the first upper electrode layer UE1 may be spaced apart from each other in the third direction DR3 by the first insulating interlayer ILD1.

FIGS. 8 and 9 show the structure in which the first insulating interlayer ILD1 is disposed between the first lower electrode layer LE1 and the first upper electrode layer UE1. However, the inventive concepts should not be limited thereto or thereby. That is, the first upper electrode layer UE1 may be directly disposed on the first lower electrode layer LE1.

The second lower electrode layer LE2 may include a plurality of second lower electrodes LE2-1, LE2-2, and LE2-3, and the second upper electrode layer UE2 may include a plurality of second upper electrodes UE2-1, UE2-2, and UE2-3. Each of the second lower electrodes LE2-1, LE2-2, and LE2-3 may extend in the first direction DR1. The second lower electrodes LE2-1, LE2-2, and LE2-3 may be disposed to be spaced apart from each other in the second direction DR2. Each of the second upper electrodes UE2-1, UE2-2, and UE2-3 may extend in the first direction DR1. The second upper electrodes UE2-1, UE2-2, and UE2-3 may be disposed to be spaced apart from each other in the second direction DR2. As an example of the present exemplary embodiment, the second lower electrodes LE2-1, LE2-2, and LE2-3 may be spaced apart from each other by a second distance d2 in the second direction DR2, and the second upper electrodes UE2-1, UE2-2, and UE2-3 may be spaced apart from each other by the second distance d2 in the second direction DR2. In this case, the second distance d2 may be smaller than the first distance d1.

As an example of the present exemplary embodiment, the second lower electrode layer LE2 includes three second lower electrodes LE2-1, LE2-2, and LE2-3, and the second upper electrode layer UE2 includes three second upper electrodes UE2-1, UE2-2, and UE2-3, however, the present exemplary embodiment should not be limited thereto or thereby.

One second lower electrode LE2-2 among the second lower electrodes LE2-1, LE2-2, and LE2-3 may not overlap the first electrode layer EL1. One second upper electrode UE2-2 among the second upper electrodes UE2-1, UE2-2, and UE2-3 may not overlap the first electrode layer EL1.

In addition, the second electrode layer EL2 includes two electrode layers of the second lower electrode layer LE2 and the second upper electrode layer UE2. However, the number of the electrode layers included in the second electrode layer EL2 should not be limited thereto or thereby. That is, the second electrode layer EL2 may include one, three, or four electrode layers.

The second lower electrode layer LE2 and the second upper electrode layer UE2 may include substantially the same material. As an example of the present exemplary embodiment, the second lower electrode layer LE2 and the second upper electrode layer UE2 may include aluminum or an alloy thereof. As another example of the present exemplary embodiment, the second lower electrode layer LE2 and the second upper electrode layer UE2 may include different materials.

The connection pad PDD1 may further include a second insulating interlayer ILD2 disposed between the second lower electrode layer LE2 and the second upper electrode layer UE2. The second insulating interlayer ILD2 may include an inorganic material. The second lower electrode layer LE2 and the second upper electrode layer UE2 may be disposed to be spaced apart from each other in the third direction DR3 by the second insulating interlayer ILD2.

FIGS. 8 and 9 show the structure in which the second insulating interlayer ILD2 is disposed between the second lower electrode layer LE2 and the second upper electrode layer UE2, however, the present exemplary embodiment should not be limited thereto or thereby. That is, the second upper electrode layer UE2 may be directly disposed on the second lower electrode layer LE2.

The connection pad PDD1 may further include a third insulating interlayer ILD3 disposed between the first electrode layer EL1 and the second electrode layer EL2. In detail, the third insulating interlayer ILD3 may be disposed between the first upper electrode layer UE1 and the second lower electrode layer LE2.

FIGS. 8 and 9 show the structure in which the third insulating interlayer ILD3 is disposed between the first upper electrode layer UE1 and the second lower electrode layer LE2, however, the present exemplary embodiment should not be limited thereto or thereby. That is, the second lower electrode layer LE2 may be directly disposed on the first upper electrode layer UE1.

The first electrode layer EL1 may include a material having a rigidity different from that of the second electrode layer EL2. As an example of the present exemplary embodiment, the first electrode layer EL1 may have the rigidity greater than that of the second electrode layer EL2. In this case, the second electrode layer EL2 may have a higher grinding level than the first electrode layer EL1 in the grinding process. That is, an amount of grinding of the second electrode layer EL2 may be greater than an amount of grinding of the first electrode layer EL1.

Each of the first lower electrodes LE1-1 and LE1-2 and the first upper electrodes UE1-1 and UE1-2 may have the same thickness and the same width. As an example of the present exemplary embodiment, each of the first lower electrodes LE1-1 and LE1-2 and the first upper electrodes UE1-1 and UE1-2 may have the thickness of about 2500 angstroms.

Each of the second lower electrodes LE2-1, LE2-2, and LE2-3 and the second upper electrodes UE2-1, UE2-2, and UE2-3 may have the same thickness and the same width. As an example of the present exemplary embodiment, each of the second lower electrodes LE2-1, LE2-2, and LE2-3 and the second upper electrodes UE2-1, UE2-2, and UE2-3 may have the thickness of about 6000 angstroms.

The connection pad PDD1 may have a first width W1 in the second direction DR2, and the first lower electrodes LE1-1 and LE1-2 may have a second width W2 that is equal to or different from a width W3 of the second lower electrodes LE2-1, LE2-2, and LE2-3. In addition, the second lower electrodes LE2-1, LE2-2, and LE2-3 may have different widths, and the second upper electrodes UE2-1, UE2-2, and UE2-3 may have different widths.

Referring to FIG. 10, the first lower electrodes LE1-1 and LE1-2 are connected to each other by a first bridge electrode BE1, and the first upper electrodes UE1-1 and UE1-2 are connected to each other by a second bridge electrode BE2. The first and second bridge electrodes BE1 and BE2 may extend in the second direction DR2, and the second bridge electrode BE2 may be disposed on the first bridge electrode BE1.

The second lower electrodes LE2-1, LE2-2, and LE2-3 may be connected to each other via a third bridge electrode BE3, and the second upper electrodes UE2-1, UE2-2, and UE2-3 may be connected to each other via a fourth bridge electrode BE4. The third and fourth bridge electrodes BE3 and BE4 may extend in the second direction DR2, and the fourth bridge electrode BE4 may be disposed on the third bridge electrode BE3.

The first and second electrode layers EL1 and EL2 may be electrically connected to the signal lines DL1 and PL. FIG. 10 shows the structure in which the first and second electrode layers EL1 and EL2 of the connection pad PDD1 are branched from the data line DL, however, the connection pad PDD1 may be branched from the power line PL. The first and second electrode layers EL1 and EL2 of the connection pad PDD1 may be electrically connected to each other through a contact hole CNT.

As an example of the present exemplary embodiment, the connection pad PDD1 may further include a third electrode layer. The third electrode layer may be disposed on the second electrode layer EL2. The third electrode layer may include a transparent conductive material.

Referring again to FIG. 8, the sealant SM may be disposed on the connection pad PDD1. FIG. 8 shows the structure in which the sealant SM is directly formed on the connection pad PDD1, however, the present exemplary embodiment should not be limited thereto or thereby. One or more insulating layers may be disposed between the sealant SM and the connection pad PDD1. The insulating layer may include an organic material or an inorganic material.

Figure 11A:
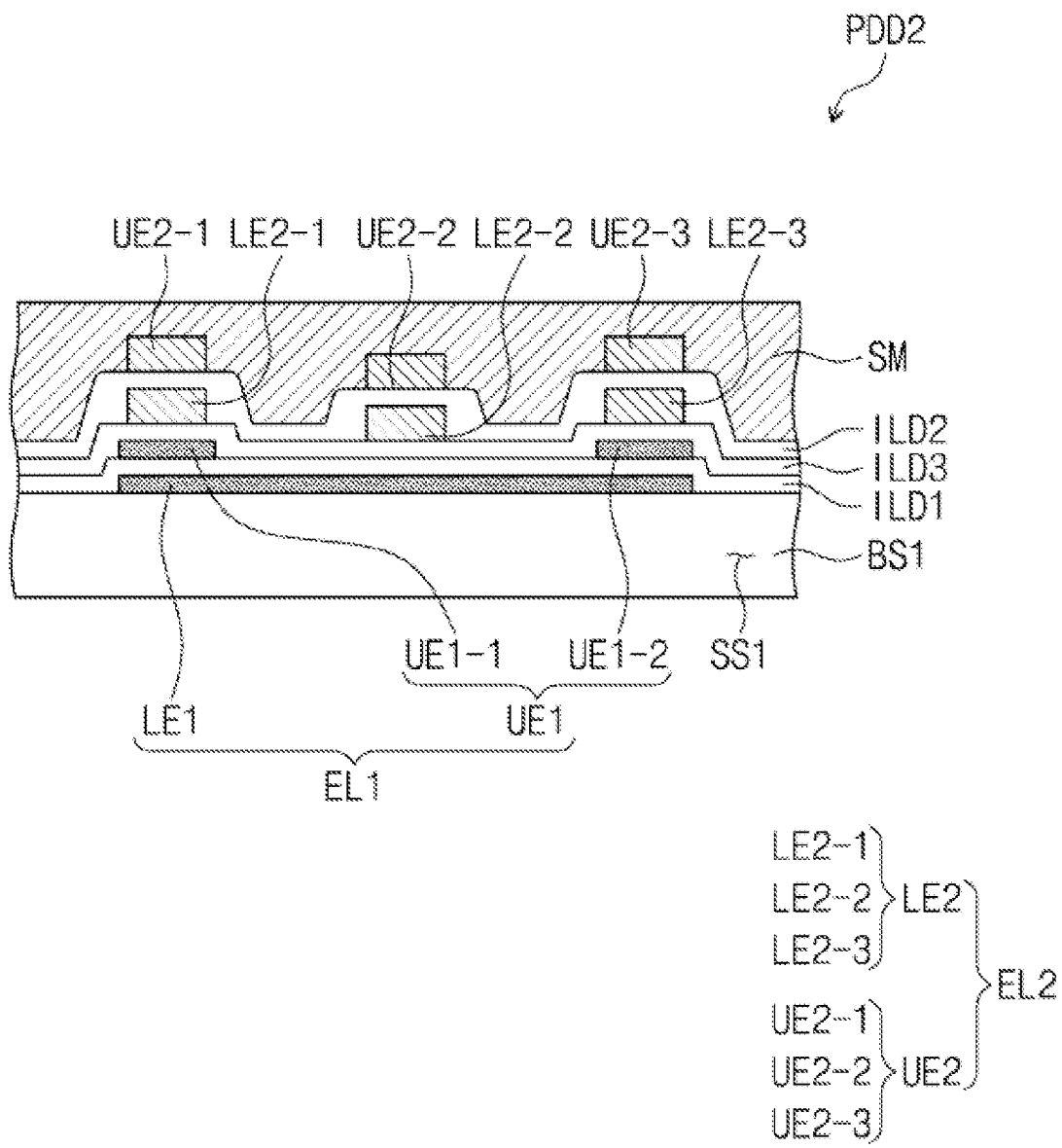
FIG. 11A is an enlarged view showing a side surface of a connection pad according to another exemplary embodiment of the present invention.
Figure 11B:
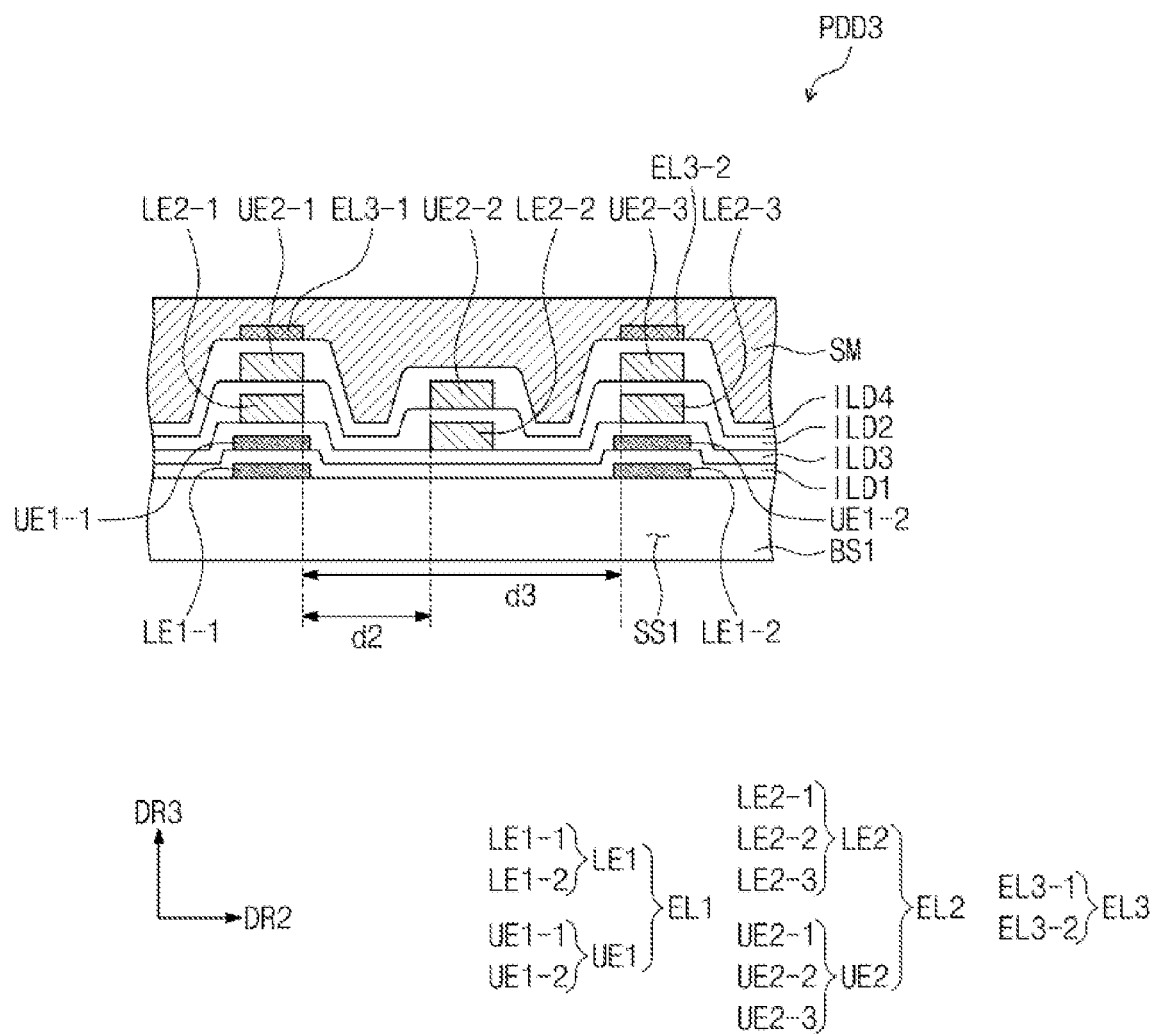
FIG. 11B is an enlarged view showing a side surface of a connection pad according to another exemplary embodiment of the present invention.
Figure 11C:
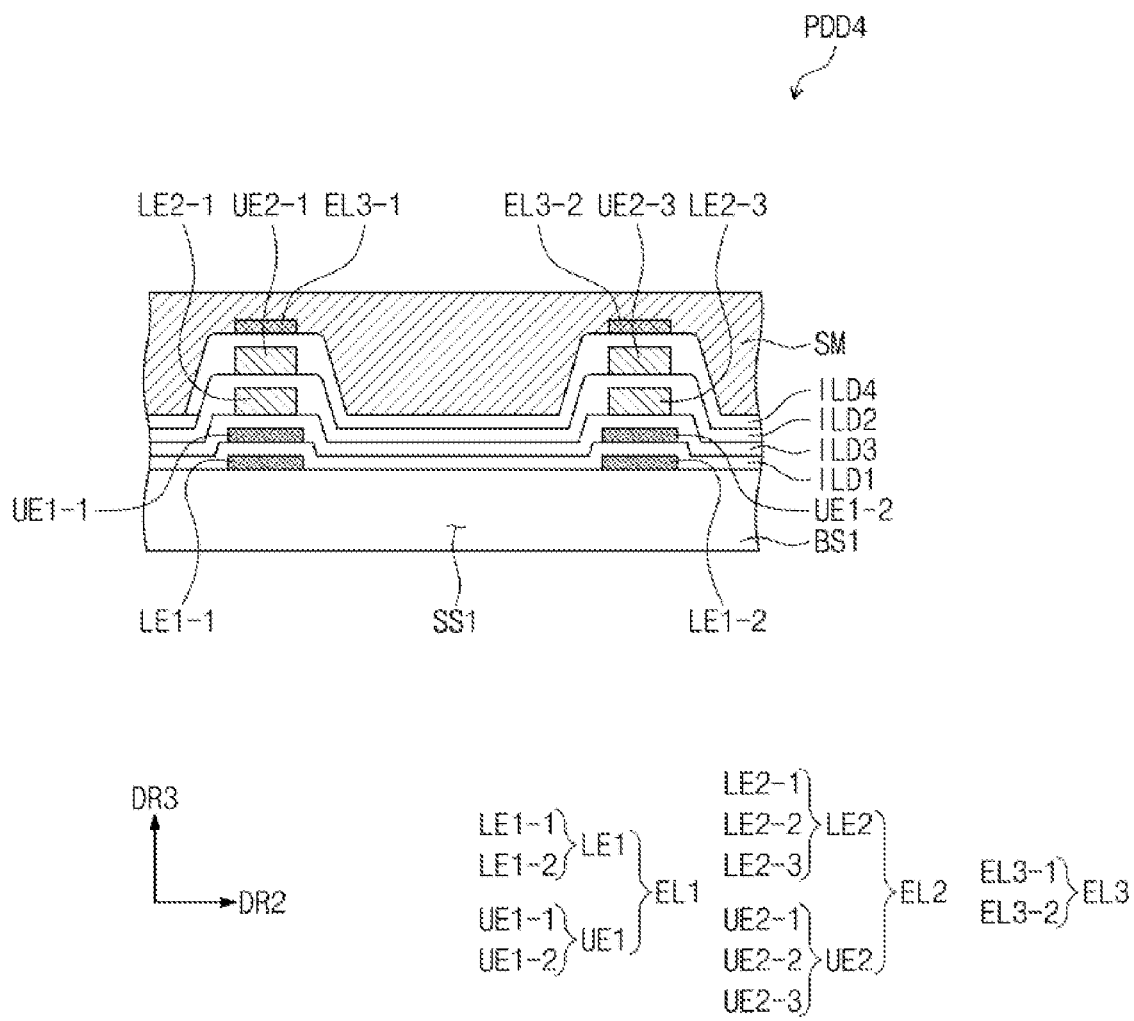
FIG. 11C is an enlarged view showing a side surface of a connection pad according to another exemplary embodiment of the present invention.

FIG. 11A is an enlarged view showing a side surface of a connection pad PDD2 according to another exemplary embodiment of the present invention. FIG. 11B is an enlarged view showing a side surface of a connection pad PDD3 according to another exemplary embodiment of the present invention. FIG. 11C is an enlarged view showing a side surface of a connection pad PDD4 according to another exemplary embodiment of the present invention.

Referring to FIG. 11A, the connection pad PDD2 includes a first electrode layer EL1 and a second electrode layer EL2. The first electrode layer EL1 includes a first lower electrode layer LE1 and a first upper electrode layer UE1. Different from the first lower electrode layer LE1 shown in FIG. 8, the first lower electrode layer LE1 includes one lower electrode. The first upper electrode layer UE1 may be disposed on the first lower electrode layer LE1 and may include a plurality of first upper electrodes UE1-1 and UE1-2.

The second electrode layer EL2 has substantially the same structure as the second electrode layer EL2 shown in FIG. 8, and thus details of the second electrode layer EL2 will be omitted.

Referring to FIG. 11B, the connection pad PDD3 may further include a third electrode layer EL3 and a fourth insulating interlayer ILD4. The third electrode layer EL3 may be disposed on a second electrode layer EL2. The third electrode layer EL3 may include a material having a rigidity different from that of first and second electrode layers EL1 and EL2. As an example of the present exemplary embodiment, the third electrode layer EL3 may include a transparent conductive material, e.g., indium tin oxide. The third electrode layer EL3 may have a rigidity smaller than that of the first electrode layer EL1 and greater than that of the second electrode layer EL2. In this case, an amount of grinding of the third electrode layer EL3 may be greater than that of the first electrode layer EL1 and smaller than that of the second electrode layer EL2.

The third electrode layer EL3 includes a plurality of sub-electrodes EL3-1 and EL3-2. The sub-electrodes EL3-1 and EL3-2 may be disposed on at least one of second upper electrodes UE2-1, UE2-2, and UE2-3. As an example of the present exemplary embodiment, the third electrode layer EL3 shown in FIG. 11B may include two sub-electrodes EL3-1 and EL3-2 (hereinafter, respectively referred to as "first and second sub-electrodes") that is smaller than the number of second upper electrodes UE2-1, UE2-2, and UE2-3. In this case, a separation distance d3 between the first and second sub-electrodes EL3-1 and EL3-2 may be greater than a separation distance d2 between the second upper electrodes UE2-1, UE2-2, and UE2-3. As another example, a plurality of sub-electrodes may be disposed to correspond to the second upper electrodes UE2-1, UE2-2, and UE2-3 in a one-to-one correspondence.

The first and second electrode layers EL1 and EL2 have substantially the same structure as the first and second electrode layers EL1 and EL2 shown in FIG. 8, and thus, details of the first and second electrode layers EL1 and EL2 will be omitted.

The connection pad PDD3 may further include a fourth insulating interlayer ILD4 interposed between the third electrode layer EL3 and the second electrode layer EL2. The fourth insulating interlayer ILD4 may include an inorganic material. The second upper electrode layer UE2 and the third electrode layer EL3 may be disposed to be spaced apart from each other in the third direction DR3 by the fourth insulating interlayer ILD4.

Referring to FIG. 11C, a second electrode layer EL2 of the connection pad PDD4 includes a second lower electrode layer LE2 and a second upper electrode layer UE2. The second lower electrode layer LE2 includes a plurality of second lower electrodes LE2-1 and LE2-3, and the second upper electrode layer UE2 includes a plurality of second upper electrodes UE2-1 and UE2-3. The second lower electrodes LE2-1 and LE2-3 may be disposed on first upper electrodes UE1-1 and UE1-2 of a first electrode layer EL1.

In this case, the second lower electrodes LE2-1 and LE2-3 may be disposed to correspond to the first upper electrodes UE1-1 and UE1-2 in a one-to-one correspondence, and the second upper electrodes UE2-1 and UE2-3 may be disposed to correspond to the second lower electrodes LE2-1 and LE2-3 in a one-to-one correspondence.

The connection pad PDD4 may further include a third electrode layer EL3 and a fourth insulating interlayer ILD4. The third electrode layer EL3 includes a plurality of sub-electrodes EL3-1 and EL3-2. The sub-electrodes EL3-1 and EL3-2 may be respectively disposed on the second upper electrodes UE2-1 and UE2-3. That is, the sub-electrodes EL3-1 and EL3-2 may be disposed to correspond to the second upper electrodes UE2-1 and UE2-3 in a one-to-one correspondence.

Figure 12:
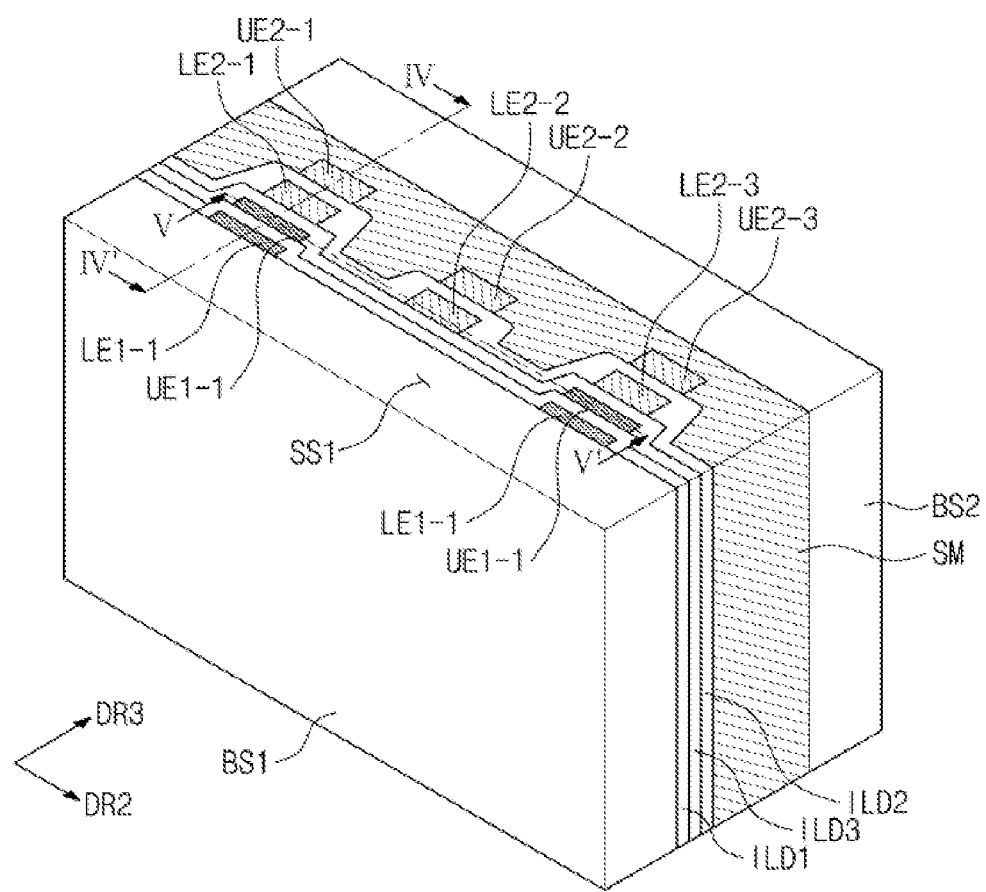
FIG. 12 is a side perspective view showing a display panel according to an exemplary embodiment of the present invention.
Figure 13A:
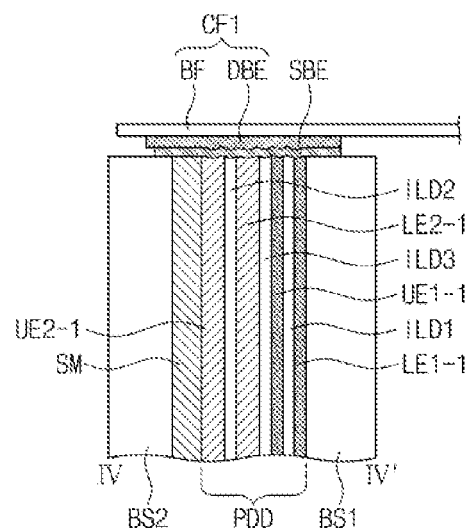
FIG. 13A is a cross-sectional view taken along a line IV-IV' shown in FIG. 12.
Figure 13B:
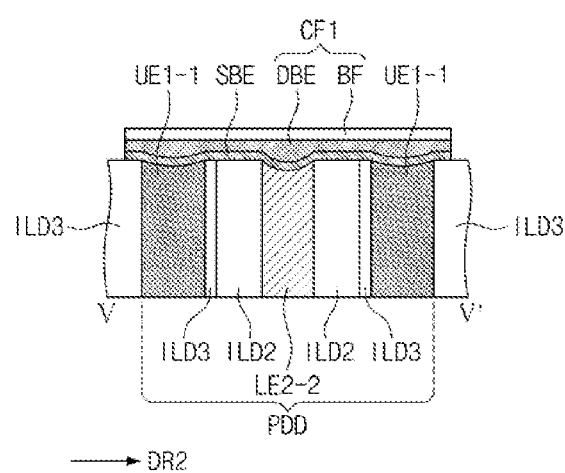
FIG. 13B is a cross-sectional view taken along a line V-V' shown in FIG. 12.

FIG. 12 is a side perspective view showing a display panel according to an exemplary embodiment of the present invention. FIG. 13A is a cross-sectional view taken along a line IV-IV' shown in FIG. 12. FIG. 13B is a cross-sectional view taken along a line V-V' shown in FIG. 12.

Referring to FIGS. 8, 12, 13A, and 13B, the side surface of the connection pad PDD1 may have the concave-convex structure in the third direction DR3 due to the difference in rigidity between the first electrode layer EL1 and the second electrode layer EL2. The side surface electrode SBE disposed on the side surface of the connection pad PDD1 has the concave-convex shape corresponding to the concave-convex structure provided on the side surface of the connection pad PDD1. That is, the side surface electrode SBE may have the concave-convex portion at the contact portion where the side surface electrode SBE and the connection pad PDD1 make contact with each other.

When the connection pad PDD1 further includes the first, second, and third insulating interlayers ILD1, ILD2, and ILD3, the difference in rigidity between the first, second, and third insulating interlayers ILD1, ILD2, and ILD3 and the first and second electrode layers EL1 and EL2 may cause the concave-convex shape on the side surface of the connection pad PDD1.

The side surface of the first electrode layer EL1 may be inwardly recessed more than the side surface SS1 of the first base substrate BS1 and side surfaces of the first to third insulating interlayers ILD1 to ILD3. In the case where the first electrode layer EL1 includes the first lower electrode layer LE1 and the first upper electrode layer UE1, the side surface of the first lower electrode layer LE1 and the side surface of the first upper electrode layer UE1 may be inwardly recessed more than the side surface SS1 of the first base substrate BS1 and the side surfaces of the first to third insulating interlayers ILD1 to ILD3.

The side surface of the second electrode layer EL2 may be inwardly recessed more than the side surface SS1 of the first base substrate BS1 and the side surfaces of the first to third insulating interlayers ILD1 to ILD3. In the case where the second electrode layer EL2 includes the second lower electrode layer LE2 and the second upper electrode layer UE2, the side surface of the second lower electrode layer LE2 and the side surface of the second upper electrode layer UE2 may be inwardly recessed more than the side surface SS1 of the first base substrate BS1 and the side surfaces of the first to third insulating interlayers ILD1 to ILD3.

Due to the difference in rigidity between the first and second electrode layers EL1 and EL2, a recessed depth of the side surface of the second electrode layer EL2 may be different from a recessed depth of the side surface of the first electrode layer EL1. That is, when the rigidity of the first electrode layer EL1 is greater than the rigidity of the second electrode layer EL2, the recessed depth of the second electrode layer EL2 may be greater than the recessed depth of the first electrode layer EL1. This is because the grinding amount of the second electrode layer EL2 is greater than the grinding amount of the first electrode layer EL1. Due to the difference in grinding amount, the concave-convex structure is formed on the side surface of the connection pad PDD1, and the concave-convex structure is reflected on the side surface electrode SBE. In the ultrasonic bonding process, when the side surface electrode has the concave-convex structure, a friction force between the side surface electrode SBE and the driving electrode DBE increases, and as a result, metal diffusion increases. Thus, the bonding characteristics and the electrical characteristics between the display panel 210 and the first flexible film CF1 may be improved.

According to the above, the connection pad includes electrode layers having different rigidities. Due to the rigidity difference, the amount of grinding of the electrode layers may be changed, and the concave-convex structure may be formed on the side surface of the connection pad due to the difference in the amount of grinding.

Since a concave-convex structure is reflected on the side surface electrode, the friction force between the side surface electrode and the driving electrode may increase during the ultrasonic bonding process. As a result, the metal diffusion increases, and thus, the bonding characteristics and the electrical characteristics between the display panel and the flexible film may be improved.

Although the exemplary embodiments of the present exemplary embodiment have been described, it is understood that the present exemplary embodiment should not be limited to these exemplary embodiments but various changes and modifications can be made by one ordinary skilled in the art within the spirit and scope of the present exemplary embodiment as hereinafter claimed. Therefore, the disclosed subject matter should not be limited to any single embodiment described herein, and the scope of the present inventive concept shall be determined according to the attached claims.

What is claimed is:

1. A display device comprising:
   a display panel comprising a display area, a non-display area defined outside the display area, a pixel disposed in the display area, a signal line connected to the pixel, and a connection pad extending from the signal line and disposed in the non-display area;
   a side surface electrode disposed on one side surface of the display panel and making contact with one side surface of the connection pad; and
   a flexible film comprising a driving electrode that directly contacts the side surface electrode, the connection pad comprising:
      a first electrode layer comprising a plurality of first electrodes extending in a first direction and spaced apart from each other in a second direction crossing the first direction; and
      a second electrode layer disposed on the first electrode layer and comprising a plurality of second electrodes extending in the first direction and spaced apart from each other in the second direction,
   wherein:
   the first electrode layer and the second electrode layer have different rigidities; and
   a side surface of the first electrode layer and a side surface of the second electrode layer directly make contact with the side surface electrode.

2. The display device of claim 1, wherein the first electrode layer comprises:
   a first lower electrode layer; and
   a first upper electrode layer disposed on the first lower electrode layer, and the plurality of first electrodes are included in at least one of the first lower electrode layer and the first upper electrode layer.

3. The display device of claim 2, wherein the connection pad further comprises a first insulating interlayer disposed between the first lower electrode layer and the first upper electrode layer.

4. The display device of claim 2, wherein:
   the first lower electrode layer comprises a plurality of first lower electrodes extending in the first direction and spaced apart from each other in the second direction; and
   the first upper electrode layer comprises a plurality of first upper electrodes extending in the first direction and spaced apart from each other in the second direction.

5. The display device of claim 4, wherein a side surface of the plurality of first lower electrodes and a side surface of the plurality of first upper electrodes contact the side surface electrode.

6. The display device of claim 4, wherein the plurality of first lower electrodes and the plurality of first upper electrodes comprise a same material.

7. The display device of claim 1, wherein the second electrode layer comprises:
   a second lower electrode layer; and
   a second upper electrode layer disposed on the second lower electrode layer, and the plurality of second electrodes are included in at least one of the second lower electrode layer and the second upper electrode layer.

8. The display device of claim 7, wherein the connection pad further comprises a second insulating interlayer disposed between the second lower electrode layer and the second upper electrode layer.

9. The display device of claim 7, wherein:
   the second lower electrode layer comprises a plurality of second lower electrodes extending in the first direction and spaced apart from each other in the second direction; and
   the second upper electrode layer comprises a plurality of second upper electrodes extending in the first direction and spaced apart from each other in the second direction.

10. The display device of claim 9, wherein a side surface of the plurality of second lower electrodes and a side surface of the plurality of second upper electrodes contact the side surface electrode.

11. The display device of claim 9, wherein the plurality of second lower electrodes and the plurality of second upper electrodes comprise a same material.

12. The display device of claim 1, wherein the plurality of first electrodes are spaced apart from each other by a first distance in the second direction, and the plurality of second electrodes are spaced apart from each other by a second distance in the second direction.

13. The display device of claim 12, wherein the second distance is smaller than the first distance.

14. The display device of claim 1, wherein the one side surface of the connection pad has a concave-convex structure in the second direction, and the side surface electrode has a shape corresponding to the concave-convex structure at a contact portion where the side surface electrode contacts the one side surface of the connection pad.

15. The display device of claim 1, wherein the connection pad further comprises a third insulating interlayer interposed between the first electrode layer and the second electrode layer.

16. The display device of claim 15, wherein the display panel further comprises a base substrate, and one side surface of the base substrate is aligned with a side surface of the third insulating interlayer.

17. The display device of claim 16, wherein:
a side surface of the first electrode layer is inwardly recessed more than the one side surface of the base substrate and the side surface of the third insulating interlayer; and
a side surface of the second electrode layer is inwardly recessed more than the one side surface of the base substrate and the side surface of the third insulating interlayer.

18. The display device of claim 17, wherein the side surface of the second electrode layer is recessed more than the side surface of the first electrode layer with respect to the one side surface of the base substrate.

19. A method of manufacturing a display device, comprising:
grinding one side surface of a display panel comprising a display area, a non-display area defined outside the display area, a pixel disposed in the display area, a signal line connected to the pixel, and a connection pad extending from the signal line and disposed in the non-display area;
forming a side surface metal layer on the one side surface of the display panel;
patterning the side surface metal layer into a plurality of side surface electrodes;
disposing a flexible film to allow a plurality of driving pads to correspond to the side surface electrodes in a one-to-one correspondence; and
electrically coupling the driving pads of the flexible film to the side surface electrodes, respectively, using an ultrasonic bonding method, the connection pad comprising:
a first electrode layer comprising a plurality of first electrodes extending in a first direction and spaced apart from each other in a second direction crossing the first direction; and
a second electrode layer disposed on the first electrode layer and comprising a plurality of second electrodes extending in the first direction and spaced apart from each other in the second direction,
wherein the first electrode layer and the second electrode layer have different rigidities.

20. The method of claim 19, wherein an amount of grinding of the first electrode layer is different from an amount of grinding of the second electrode layer in the grinding of the display panel.

\* \* \* \* \*